United States Patent
Komuro et al.

(10) Patent No.: US 10,111,328 B2
(45) Date of Patent: Oct. 23, 2018

(54) PHOTOSENSITIVE RESIN COMPOSITION, DRY FILM USING SAME, PRINTED WIRING BOARD, AND METHOD FOR PRODUCING PRINTED WIRING BOARD

(71) Applicant: HITACHI CHEMICAL COMPANY, LTD., Tokyo (JP)

(72) Inventors: Nobuhito Komuro, Kamisu (JP); Shinya Oosaki, Kamisu (JP); Toshizumi Yoshino, Katori (JP); Kuniaki Satou

(73) Assignee: HTACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/772,500

(22) PCT Filed: Mar. 6, 2014

(86) PCT No.: PCT/JP2014/055822
§ 371 (c)(1),
(2) Date: Sep. 3, 2015

(87) PCT Pub. No.: WO2014/136897
PCT Pub. Date: Sep. 12, 2014

(65) Prior Publication Data
US 2016/0007454 A1 Jan. 7, 2016

(30) Foreign Application Priority Data
Mar. 7, 2013 (JP) ................. 2013-045333

(51) Int. Cl.
| | | |
|---|---|---|
| G03F 7/038 | (2006.01) | |
| H05K 1/03 | (2006.01) | |
| C08L 63/10 | (2006.01) | |
| G03F 7/004 | (2006.01) | |
| G03F 7/027 | (2006.01) | |
| G03F 7/029 | (2006.01) | |
| H05K 3/28 | (2006.01) | |
| C08K 3/36 | (2006.01) | |
| C08K 5/3495 | (2006.01) | |
| C09D 163/10 | (2006.01) | |
| G03F 7/40 | (2006.01) | |
| H05K 3/02 | (2006.01) | |
| H05K 3/06 | (2006.01) | |
| C08L 63/00 | (2006.01) | |
| C08K 5/37 | (2006.01) | |
| C08K 5/5313 | (2006.01) | |

(52) U.S. Cl.
CPC ............ *H05K 1/0373* (2013.01); *C08K 3/36* (2013.01); *C08K 5/3495* (2013.01); *C08L 63/00* (2013.01); *C08L 63/10* (2013.01); *C09D 163/10* (2013.01); *G03F 7/004* (2013.01); *G03F 7/027* (2013.01); *G03F 7/029* (2013.01); *G03F 7/038* (2013.01); *G03F 7/0385* (2013.01); *G03F 7/0388* (2013.01); *G03F 7/40* (2013.01); *H05K 3/022* (2013.01); *H05K 3/064* (2013.01); *H05K 3/287* (2013.01); *C08K 5/37* (2013.01); *C08K 5/5313* (2013.01)

(58) Field of Classification Search
CPC ....................................................... G03F 7/0385
See application file for complete search history.

(56) References Cited

U.S. PATENT DOCUMENTS

| | | | | |
|---|---|---|---|---|
| 4,925,773 A | * | 5/1990 | Miyamura | ............ B23K 35/224 430/285.1 |
| 5,055,378 A | * | 10/1991 | Miyamura | ........... C08F 299/022 430/280.1 |
| 2005/0260522 A1 | * | 11/2005 | Weber et al. | ....... C08G 59/3218 430/280.1 |
| 2008/0096133 A1 | * | 4/2008 | Kato | ..................... C08F 283/10 430/286.1 |
| 2011/0223539 A1 | * | 9/2011 | Kurafuchi et al. | ... G03F 7/0385 430/280.1 |

FOREIGN PATENT DOCUMENTS

| | | | |
|---|---|---|---|
| EP | 1 138 494 A2 | * | 10/2001 |
| JP | 268 A | | 1/1990 |
| JP | 11240930 A | | 9/1999 |
| JP | 2008-299294 a | * | 12/2008 |

(Continued)

OTHER PUBLICATIONS

English translation of JP, 2008-299294, A (2008) from machine translation from AIPN Japan Patent Office National Center for Industrial Property Information and Training, generated May 8, 2017, 28 pages.*
International Search Report for International Japanese Application No. PCT/JP2014/055822 dated Jun. 3, 2014.
Office action of TW Appln. No. 103107922 dated Mar. 15, 2017.

(Continued)

*Primary Examiner* — Cynthia Hamilton
(74) *Attorney, Agent, or Firm* — Fitch, Even, Tabin & Flannery, LLP

(57) ABSTRACT

The present invention relates to a photosensitive resin composition containing (A) an acid-modified vinyl group-containing epoxy resin, (B) a photopolymerization initiator, (C) a thiol group-containing compound, and (E) a photopolymerizable compound, wherein the component (A) contains at least one acid-modified vinyl group-containing epoxy resin (A1) which is obtained from a bisphenol-novolak epoxy resin (a1) having a structural unit represented by a general formula (IV) or (V), and an acid-modified vinyl group-containing epoxy resin (A2) which is obtained from an epoxy resin (a2) differing from the epoxy resin (a1).

21 Claims, 1 Drawing Sheet

(56) References Cited

FOREIGN PATENT DOCUMENTS

| | | | |
|---|---|---|---|
| JP | 2013125138 | A | 6/2013 |
| JP | 2003198105 | A | 7/2013 |
| JP | 2013218146 | A | 10/2013 |
| TW | 200912534 | A | 3/2009 |
| WO | 2008140016 | A1 | 11/2008 |
| WO | 2010026927 | A1 | 3/2010 |
| WO | 2013022068 | A1 | 2/2013 |
| WO | 2013161756 | A1 | 10/2013 |

* cited by examiner

Rectangula  Trapezoida

Undercut  Flare (Halation)  Spread Bulge

PHOTOSENSITIVE RESIN COMPOSITION, DRY FILM USING SAME, PRINTED WIRING BOARD, AND METHOD FOR PRODUCING PRINTED WIRING BOARD

TECHNICAL FIELD

The present invention relates to a photosensitive resin composition, and to a dry film, a printed wiring board, and a method for producing a printed wiring board using the composition.

BACKGROUND ART

In the field of printed wiring boards, heretofore, forming a permanent mask resist on a printed wiring board has been carried out. In use of a printed wiring board, the permanent mask resist therein plays a role of preventing the conductor layers from being corroded and a role of securing electric insulation between the conductor layers therein. Recently, the permanent mask resist has come to play an addition role as a solder resist film for preventing solder from adhering to any unnecessary part of the conductor layers in a printed wiring board, also in a step of flip chip bonding or wire bonding for mounting semiconductor elements on a printed wiring board via solder.

Heretofore, in production of printed wiring boards, the permanent mask resist has been produced according to a screen printing method using a thermosetting resin composition or according to a photographic method using a photosensitive resin composition.

For example, in flexible wiring boards using a mounting mode of FC (flip chip) bonding, TAB (tape automated bonding) or COF (chip on film) bonding, a thermosetting resin paste is screen-printed and then thermally cured to form a permanent mask resist, except the area of IC chips, electronic members, LCD (liquid-crystal display) panels and interconnection wiring pattern parts (for example, see PTL 1).

On the other hand, in a semiconductor package substrate for BGA (ball grid array), CSP (chip size package) or the like mounted on electronic components, (1) for flip-chip-mounting of semiconductor elements on a semiconductor package substrate via solder, or (2) for wire-bonding of semiconductor elements to a semiconductor package substrate, or (3) for soldering a semiconductor package substrate to a mother board substrate, the permanent mask resist in the bonding part must be removed, and for forming an image of the permanent mask resist, there is employed a photographic method for image formation that includes coating with a photosensitive resin composition, drying it, then curing it through selective irradiation with an active ray such as UV ray or the like, and thereafter removing the non-irradiated part alone through development to form the intended image. The photographic method is suitable to large-scale mass-production owing to the good operability thereof, and is therefore widely used for image formation with a photographic material in the industrial field of electronic materials (for example, see PTL 2).

CITATION LIST

Patent Literature

[PTL 1] JP-A 2003-198105
[PTL 2] JP-A 11-240930

SUMMARY OF INVENTION

Technical Problem

However, in a case of using a photosensitive resin composition with a pigment and a filler added thereto, as described in PTL 2, the pigment and the filler would interfere with UV ray penetration or would absorb UV ray. Therefore, in the case of forming a thick permanent resist, there are some cases where the photosensitive resin composition at the bottom could not be sufficiently photocured to thereby cause an undercut where the bottom part is bored after development.

When the dose of UV irradiation is increased in order to improve the photocurability at the bottom, light diffraction and halation would be also increased, which causes a problem that the line width of the intermediate part (center part) and the deepest part (bottom part) is increased as compared with the line width of the surface part (top part) of the pattern cross section, that is, the resist profile is deteriorated or the resolution is lowered. In addition, since the photocuring would be insufficient in the region from the surface to 3 μm or so in the resist depth direction owing to oxygen inhibition, there may occur still another problem that the upper part of the resist may drop off to deteriorate the resist profile. Consequently, in the case of forming a thick permanent mask resist of from 20 to 40 μm or more, no photosensitive resin composition exhibiting good photocurability at the bottom and excellent in resolution is provided so far.

Further, with the recent tendency toward mini-sized high-performance electronic instruments, the hole diameter in a permanent mask resist and the distance between the center of the holes (hole diameter 100 μm/hole center distance 100 μm, or hole diameter 80 μm/hole center distance 80 μm) has become small-sized. Accordingly, for example, in flip-chip bonding, a permanent mask resist exhibiting excellent resist profile, as well as improved resolution, is desired from the viewpoint of solder-filling performance.

An object of the present invention is to provide a photosensitive resin composition which is free from a problem that an undercut where the bottom of the resist is bored is caused or the top of the resist is dropped off and does not provide a large line width in the intermediate part (center part) and the deepest part (bottom part) as compared with the line width in the surface part in terms of the pattern cross section, that is, which is capable of forming a pattern that has good linearity with respect to the pattern outline profile and is excellent in resolution, and also to provide a dry film, printed wiring board, and a production method for such a printed wiring board using the composition.

Solution to Problem

The present inventors have assiduously studied for the purpose of solving the above-mentioned problems and, as a result, have found that the problems can be solved by the present invention described below. Specifically, the present invention provides a photosensitive resin composition described below, a dry film, a printed wiring board, and a production method for such a printed wiring board using the composition.

[1] A photosensitive resin composition comprising (A) an acid-modified vinyl group-containing epoxy resin, (B) a photopolymerization initiator, (C) a thiol group-containing compound, and (E) a photopolymerizable compound, wherein the component (A) contains at least one acid-modified vinyl group-containing epoxy resin (A1) which is obtained from a bisphenol-novolak epoxy resin (a1) having a structural unit represented by the following general formula (IV) or (V), and an acid-modified vinyl group-containing epoxy resin (A2) which is obtained from an epoxy resin (a2) differing from the epoxy resin (a1).

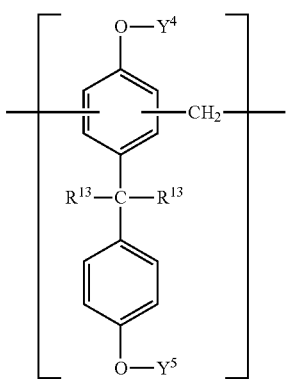

(IV)

In the general formula (IV), $R^{13}$ represents a hydrogen atom or a methyl group, $Y^4$ and $Y^5$ each independently represent a hydrogen atom or a glycidyl group, and plural $R^{13}$'s may be the same or different, with the proviso that at least one of $Y^4$ and $Y^5$ is a glycidyl group.

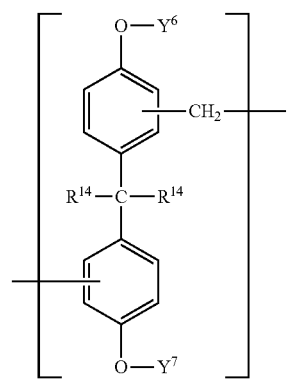

(V)

In the general formula (V), $R^{14}$ represents a hydrogen atom or a methyl group, $Y^6$ and $Y^7$ each independently represent a hydrogen atom or a glycidyl group, and plural $R^{14}$'s may be the same or different, with the proviso that at least one of $Y^6$ and $Y^7$ is a glycidyl group.

[2] A dry film having a carrier film and a photosensitive layer using the photosensitive resin composition according to the above [1].

[3] A printed wiring board that comprises a permanent mask resist formed of the photosensitive resin composition according to the above [1].

[4] A method for producing a printed wiring board that comprises, in this order, a step of providing, on a substrate, a photosensitive layer using the photosensitive resin composition according to the above [1] or the dry film according to the above [2], a step of patterning the photosensitive layer, and a step of curing the photosensitive layer to form a permanent mask resist.

Advantageous Effects of Invention

According to the present invention, there are provided a photosensitive resin composition which is free from a problem that an undercut where the bottom part is bored occurs or the top of the resist is dropped off, that is, which is capable of forming a pattern that has good linearity with respect to the pattern outline profile and is excellent in resolution, and also a dry film, a printed wiring board, and a production method for such a printed wiring board using the composition.

DESCRIPTION OF EMBODIMENTS

[Photosensitive Resin Composition]

Figure 1:
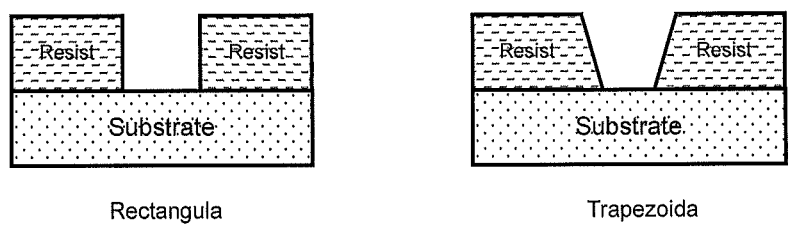
FIG. 1 shows schematic views of good resist cross section profiles.

The photosensitive resin composition of the present invention contains (A) an acid-modified vinyl group-containing epoxy resin, (B) a photopolymerization initiator, (C) a thiol group-containing compound, and (E) a photopolymerizable compound, wherein the component (A) is obtained from an epoxy resin having a predetermined structural unit.

The photosensitive resin composition of the present invention has the above-mentioned constitution and therefore makes it possible to improve the photocurability at the bottom thereof, and consequently, the resin composition is free from a problem that an undercut where the bottom of the resist is bored occurs or the top of the resist is dropped off and does not require increasing the dose of UV irradiation. For these reasons, it is considered that the resin composition can form a thick-film pattern having good linearly in the pattern outline profile and excellent in resolution. In addition, as having the above-mentioned specific constitution, the photosensitive resin composition of the present invention can also form a permanent mask resist excellent in electroless platability and in soldering heat resistance.

The components are described below.

<(A) Acid-Modified Vinyl Group-Containing Epoxy Resin>

The acid-modified vinyl group-containing epoxy resin (A) for use in the photosensitive resin composition of the present invention contains at least one acid-modified vinyl group-containing epoxy resin (A1) which is obtained from a bisphenol-novolak epoxy resin (a1) having a structural unit represented by the following general formula (IV) or (V), and an acid-modified vinyl group-containing epoxy resin (A2) which is obtained from an epoxy resin (a2) differing from the epoxy resin (a1).

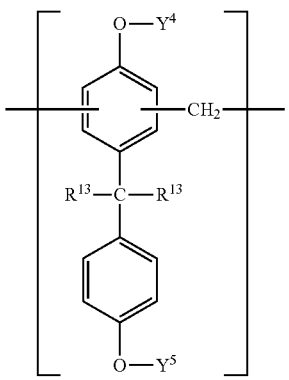

(IV)

In the general formula (IV), $R^{13}$ represents a hydrogen atom or a methyl group, $Y^4$ and $Y^5$ each independently represent a hydrogen atom or a glycidyl group, and plural $R^{13}$'s may be the same or different, with the proviso that at least one of $Y^4$ and $Y^5$ is a glycidyl group.

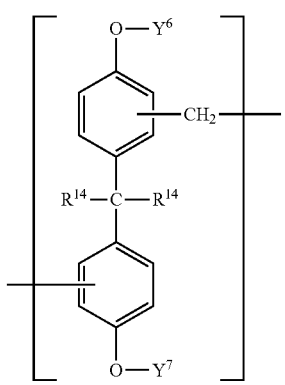

(V)

In the general formula (V), $R^{14}$ represents a hydrogen atom or a methyl group, $Y^6$ and $Y^7$ each independently represent a hydrogen atom or a glycidyl group, and plural $R^{14}$'s may be the same or different, with the proviso that at least one of $Y^6$ and $Y^7$ is a glycidyl group.

(Epoxy Resin (a1))

The epoxy resin (a1) is, from the viewpoint of more effectively preventing the thin-film substrate from being warped and improving more the thermal shock resistance of the substrate, and from the viewpoint of obtaining a photosensitive resin composition capable of forming a pattern excellent in resolution, a bisphenol-novolak epoxy resin having a structural unit represented by the above-mentioned general formula (IV) or (V), and is preferably a bisphenol-novolak epoxy resin having a structural unit represented by the general formula (IV).

[Epoxy Resin Having a Structural Unit Represented by General Formula (IV)]

As the epoxy resin (a1), preferably mentioned is a bisphenol-novolak epoxy resin having a structural unit represented by the following general formula (IV).

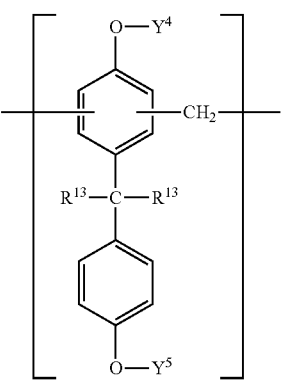

(IV)

In the general formula (IV), $R^{13}$ represents a hydrogen atom or a methyl group, and is preferably a hydrogen atom from the viewpoint of obtaining a photosensitive resin composition capable of forming a pattern excellent in resolution. Plural $R^{13}$'s may be the same or different.

$Y^4$ and $Y^5$ each independently represent a hydrogen atom or a glycidyl group, and are, from the same viewpoint as above, preferably a glycidyl group, with the proviso that at least one of $Y^4$ and $Y^5$ is a glycidyl group.

The number of the repeating units of the structural unit represented by the general formula (IV) in the bisphenol-novolak epoxy resin having the structural unit represented by the general formula (IV) is 1 or more, preferably from 10 to 100, more preferably from 15 to 80, even more preferably from 15 to 70. The number of the repeating units that falls within the above range makes it possible to form a pattern excellent in resist profile and in resolution and makes it possible to realize excellent heat resistance, adhesiveness and electric insulation.

[Epoxy Resin Having a Structural Unit Represented by General Formula (V)]

As the epoxy resin (a1), also preferably mentioned is a bisphenol-novolak epoxy resin having a structural unit represented by the following general formula (V).

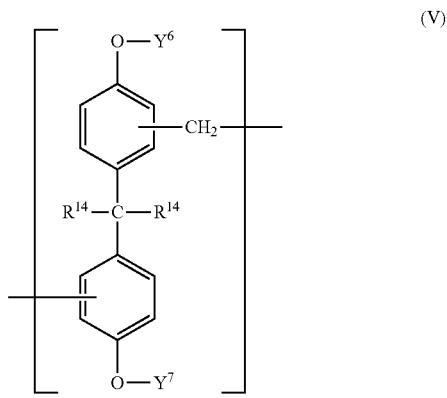

(V)

In the general formula (V), $R^{14}$ represents a hydrogen atom or a methyl group, and is preferably a hydrogen atom from the viewpoint of obtaining a photosensitive resin composition capable of forming a pattern excellent in resolution. Plural $R^{14}$'s may be the same or different.

$Y^6$ and $Y^7$ each independently represent a hydrogen atom or a glycidyl group, and are, from the same viewpoint as above, preferably a glycidyl group, with the proviso that at least one of $Y^6$ and $Y^7$ is a glycidyl group.

The number of the repeating units of the structural unit represented by the general formula (V) in the bisphenol-novolak epoxy resin having the structural unit represented by the general formula (V) is 1 or more, preferably from 10 to 100, more preferably from 15 to 80, even more preferably from 15 to 70. The number of the repeating units that falls within the above range makes it possible to form a pattern excellent in resist profile and in resolution and makes it possible to realize excellent heat resistance, adhesiveness and electric insulation.

Of the general formula (V), those where $R^{14}$ is a hydrogen atom and $Y^6$ and $Y^7$ each are a glycidyl group are commercially available as EXA-7376 series (trade name, manufactured by DIC Corporation), and those where $R^{14}$ is a methyl group and $Y^6$ and $Y^7$ each are a glycidyl group are as EPON SU8 series (trade name, manufactured by Japan Epoxy Resin Co., Ltd.).

(Epoxy Resin (a2))

Not specifically limited, the epoxy resin (a2) is may be any epoxy resin that differs from the epoxy resin (a1); however, from the viewpoint of obtaining a photosensitive resin composition capable of forming a pattern excellent in resolution, preferred is at least one selected from novolak epoxy resins having a structural unit represented by the following general formula (I), bisphenol A-type epoxy resins or bisphenol F-type epoxy resins having a structural unit represented by the following formula (II), and triphenolmethane-type epoxy resins having a structural unit represented by the following general formula (III), more preferred is at least one selected from novolak epoxy resins having a structural unit represented by the general formula (I) and bisphenol A-type epoxy resins and bisphenol F-type epoxy resins having a structural unit represented by the general formula (II), even more preferred is at least one selected from bisphenol A-type epoxy resins and bisphenol F-type epoxy resins having a structural unit represented by the general formula (II), and especially more preferred are bisphenol F-type epoxy resins represented by the general formula (II).

Also from the same viewpoint, it is especially desirable that the acid-modified vinyl group-containing epoxy resin (A1) is one obtained from a bisphenol-novolak epoxy resin having a structural unit represented by the above-mentioned general formula (IV), and the acid-modified vinyl group-containing epoxy resin (A2) is one obtained from the bisphenol A-type epoxy resin or the bisphenol F-type epoxy resin represented by the above-mentioned general formula (II).

[Epoxy Resin Having a Structural Unit Represented by General Formula (I)]

As the epoxy resin (a2), preferably mentioned is a novolak epoxy resin having a structural unit represented by the following general formula (I), and the novolak epoxy resin having such a structural unit includes, for example a novolak epoxy resin represented by the following formula (P).

In the general formulae (I) and (I'), $R^{11}$ represents a hydrogen atom or a methyl group, and is preferably a hydrogen atom from the viewpoint of obtaining a photosensitive resin composition capable of forming a pattern excellent in resolution.

$Y^1$ represents a hydrogen atom or a glycidyl group. In the general formula (I'), the molar ratio of $Y^1$ of a hydrogen atom to $Y^1$ of a glycidyl group is, from the same viewpoint as above, preferably from 0/100 to 30/70, more preferably from 0/100 to 10/90. As known from the molar ratio, in the general formula (I'), at least one of $Y^1$ is a glycidyl group.

$n_1$ indicates a number of 1 or more, and is preferably from 10 to 200, more preferably from 30 to 150, even more preferably from 30 to 100. $n_1$ falling within the range realizes a pattern excellent in resist profile and in resolution, and realizes excellent heat resistance, adhesiveness and electric insulation.

Plural $R^{11}$'s may be the same or different. When $n_1$ is 2 or more, plural $Y^1$'s may be the same or different.

The novolak epoxy resin represented by the general formula (I') includes a phenol-novolak epoxy resin and a cresol-novolak epoxy resin. Those novolak epoxy resins may be obtained, for example, by reacting a phenol-novolak resin or a cresol-novolak resin with an epichlorohydrin according to a known method.

The phenol-novolak epoxy resin and the cresol-novolak epoxy resin represented by the general formula (I') are commercially available, for example, as YDCN-701, YDCN-702, YDCN-703, YDCN-704, YDCN-704L, YDPN-638 and YDPN-602 (all trade names, manufactured by Nippon Steel Chemical Co., Ltd.), DEN-431 and DEN-439 (both trade names, manufactured by Dow Chemical Co., Ltd.), EOCN-120, EOCN-102S, EOCN-103S, EOCN-104S, EOCN-1012, EOCN-1025, EOCN-1027 and BREN (all trade names, manufactured by Nippon Kayaku Co., Ltd.), EPN-1138, EPN-1235 and EPN-1299 (all trade names, manufactured by BASF Japan Ltd.), N-730, N-770, N-865, N-665, N-673, VH-4150 and VII-4240 (all trade names, manufactured by DIC Corporation), etc.

[Epoxy Resin Having a Structural Unit Represented by General Formula (II)]

As the epoxy resin (a2), preferably mentioned is a bisphenol A-type epoxy resin or the bisphenol F-type epoxy resin having a structural unit represented by the following general formula (II). The epoxy resin having such a structural unit includes, for example, a bisphenol A-type epoxy resin or a bisphenol F-type epoxy resin represented by the following general formula (II').

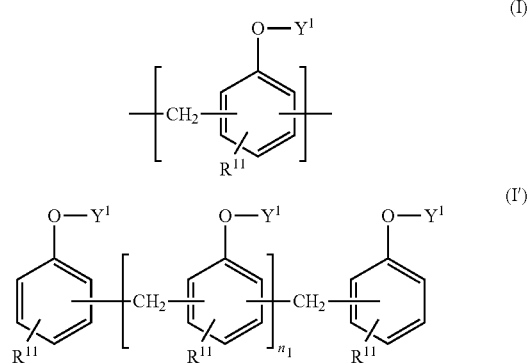

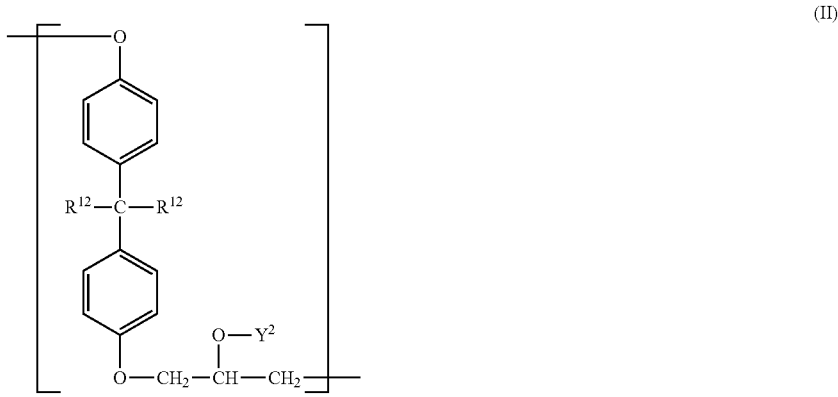

-continued

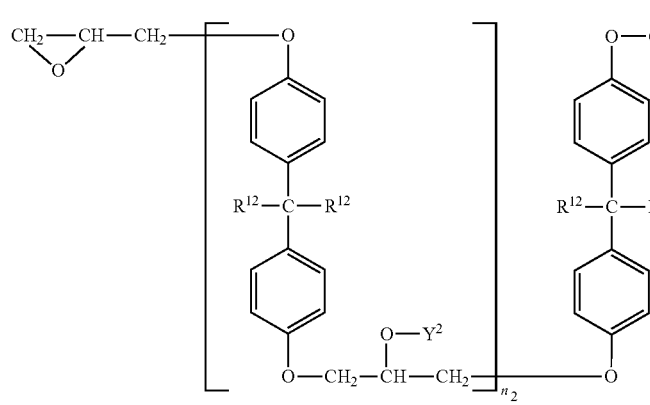
(II')

In the general formulae (II) and (II'), $R^{12}$ represents a hydrogen atom or a methyl group, and is preferably a hydrogen atom from the viewpoint of obtaining a photosensitive resin composition capable of forming a pattern excellent in resolution. $Y^2$ represents a hydrogen atom or a glycidyl group.

$n_2$ indicates a number of 1 or more, and is preferably from 10 to 100, more preferably from 10 to 80, even more preferably from 15 to 60. $n_2$ falling within the range realizes a pattern excellent in resist profile and in resolution, and realizes excellent heat resistance, adhesiveness and electric insulation.

Plural $R^{12}$'s may be the same or different. When $n_2$ is 2 or more, plural $Y^2$'s may be the same or different.

The bisphenol A-type epoxy resin or the bisphenol F-type epoxy resin represented by the general formula (II) where $Y^2$ is a glycidyl group may be obtained, for example, by reacting the hydroxyl group (—$OY^2$) of the bisphenol A-type epoxy resin or the bisphenol F-type epoxy resin represented by the general formula (II) where $Y^2$ is a hydrogen atom with an epichlorohydrin.

For promoting the reaction of the hydroxyl group and an epichlorohydrin, it is desirable that the reaction is carried out at a reaction temperature of from 50 to 120° C. in the presence of an alkali metal hydroxide in a polar organic solvent such as dimethylformamide, dimethylacetamide, dimethyl sulfoxide or the like. The reaction temperature falling within the range may prevent the reaction from being too slow and may prevent any side reaction.

The bisphenol A-type epoxy resin and the bisphenol F-type epoxy resin represented by the general formula (II') are commercially available, for example, as Epikote 807, 815, 825, 827, 828, 834, 1001, 1004, 1007 and 1009 (all trade names, manufactured by Japan Epoxy Resin Co., Ltd.), DER-330, DER-301 and DER-361 (All trade names, manufactured by Dow Chemical Co., Ltd.), YD-8125, YDF-170, YDF-170, YDF-175S, YDF-2001, YDF-2004 and YDF-8170 (all trade names, manufactured by Nippon Steel Chemical Co., Ltd.), etc.

[Epoxy Resin Having a Structural Unit Represented by General Formula (III)]

As the epoxy resin (a2), preferably mentioned is a triphenolmethane-type epoxy having a structural unit represented by the following general formula (III). The triphenolmethane-type epoxy resin having such a structural unit includes, for example, a triphenolmethane-type epoxy resin represented by the following general formula (III').

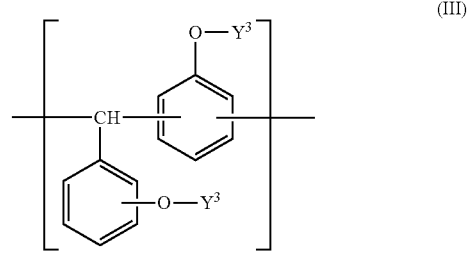
(III)

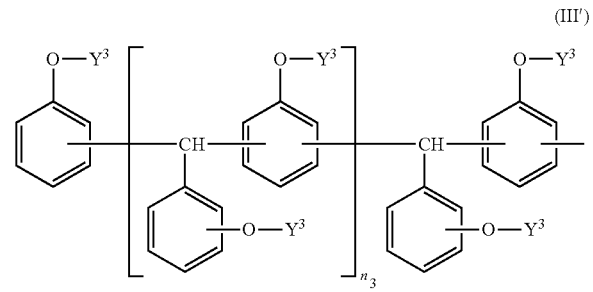
(III')

In the general formulae (III) and (III'), $Y^3$ represents a hydrogen atom or a glycidyl group. The molar ratio of hydrogen atom to glycidyl group is, from the viewpoint of obtaining a photosensitive resin composition capable of forming a pattern excellent in resolution, preferably from 0/100 to 30/70. As known from the molar ratio, at least one of $Y^3$ is a glycidyl group.

$n_3$ indicates a number of 1 or more, and is preferably from 10 to 100, more preferably from 15 to 80, even more preferably from 15 to 70. $n_2$ falling within the range realizes a pattern excellent in resist profile and in resolution, and realizes excellent heat resistance, adhesiveness and electric insulation.

Plural $Y^3$'s may be the same or different.

The triphenolmethane-type epoxy resin represented by the general formula (III') is commercially available, for example, as FAE-2500, EPPN-501H and EPPN-502H (all trade names, manufactured by Nippon Kayaku Co., Ltd.), etc.

From the viewpoint of obtaining a photosensitive resin composition capable of forming a pattern having good linearity and being excellent in resolution, the acid-modified vinyl group-containing epoxy resins (A1) and (A2) for use in the present invention are preferably resins obtained by reacting resins (A1') and (A2') (hereinafter the resin is simply referred to as "resin (A')"), which are obtained by reacting the above-mentioned epoxy resins (a1) and (a2) (hereinafter simply referred to as "epoxy resin (a)") with a vinyl group-containing monocarboxylic acid (b), respectively, with a saturated or unsaturated group-containing polybasic acid anhydride (c), respectively.

[Vinyl Group-Containing Monocarboxylic Acid (b)]

As the above-mentioned vinyl group-containing monocarboxylic acid (b), for example, preferably mentioned are acrylic acid and acrylic acid derivatives such as acrylic acid dimer, methacrylic acid, β-furfurylacrylic acid, β-styrylacrylic acid, cinnamic acid, crotonic acid, α-cyanocinnamic acid, etc.; half ester compounds that are reaction products of a hydroxyl group-containing acrylate and a dibasic acid anhydride; half ester compounds that are reaction products of a vinyl group-containing monoglycidyl ether or a vinyl group-containing monoglycidyl ester and a dibasic acid anhydride, etc.

The half ester compounds can be obtained by reacting a hydroxyl group-containing acrylate, a vinyl group-containing monoglycidyl ether or a vinyl group-containing monoglycidyl ester and a dibasic acid anhydride in an equimolar ratio. One alone or two or more types of those vinyl group-containing monocarboxylic acids (b) may be used here either singly or as combined.

The hydroxyl group-containing acrylate, the vinyl group-containing monoglycidyl ether and the vinyl group-containing monoglycidyl ester that are used in producing the above-mentioned half ester compounds, examples of the vinyl group-containing monocarboxylic acid (b), include, for example, hydroxyethyl acrylate, hydroxyethyl methacrylate, hydroxypropyl acrylate, hydroxypropyl methacrylate, hydroxybutyl acrylate, hydroxybutyl methacrylate, polyethylene glycol monoacrylate, polyethylene glycol monomethacrylate, trimethylolpropane diacrylate, trimethylolpropane dimethacrylate, pentaerythritol triacrylate, pentaerythritol trimethacrylate, dipentaerythritol pentacrylate, pentaerythritol pentamethacrylate, glycidyl acrylate, glycidyl methacrylate, etc.

As the dibasic acid anhydride for synthesis of the above-mentioned half ester compounds, usable here are those containing a saturated group or those containing an unsaturated group. Specific examples of the dibasic acid anhydride include succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahydrophthalic anhydride, ethylhexahydrophthalic anhydride, itaconic anhydride, etc.

In the reaction between the above-mentioned epoxy resin (a) and the vinyl group-containing monocarboxylic acid (b), it is desirable that the two are reacted in such a ratio that the amount of the vinyl group-containing monocarboxylic acid (b) could be from 0.6 to 1.05 equivalents relative to one equivalent of the epoxy group in the epoxy resin (a), more preferably in a ratio of from 0.8 to 1.0 equivalent. The reaction in the ratio is preferred as the photopolymerization is improved or, that is, the photosensitivity is increased.

The epoxy resin (a) and the vinyl group-containing monocarboxylic acid (b) may be reacted, as dissolved in an organic solvent.

Preferred examples of the organic solvent include, for example, ketones such as methyl ethyl ketone, cyclohexanone, etc.; aromatic hydrocarbons such as toluene, xylene, tetramethylbenzene, etc.; glycol ethers such as methyl cellosolve, butyl cellosolve, methyl carbitol, butyl carbitol, propylene glycol monomethyl ether, dipropylene glycol monoethyl ether, dipropylene glycol diethyl ether, triethylene glycol monoethyl ether, etc.; esters such as ethyl acetate, butyl acetate, butyl cellosolve acetate, carbitol acetate, etc.; aliphatic hydrocarbons such as octane, decane, etc.; petroleum solvents such as petroleum ether, petroleum naphtha, hydrogenated petroleum naphtha, solvent naphtha, etc.

Further, it is desirable to use a catalyst for promoting the reaction between the epoxy resin (a) and the vinyl group-containing monocarboxylic acid (b). The catalyst usable here includes, for example, triethylamine, benzyldimethylamine, methyltriethylammonium chloride, benzyltrimethylammonium chloride, benzyltrimethylammonium bromide, benzyltrimethylammonium iodide, triphenyl phosphine, etc.

The amount of the catalyst to be used is preferably from 0.01 to 10 parts by mass relative to 100 parts by mass of the total of the epoxy resin (a) and the vinyl group-containing monocarboxylic acid (b), more preferably from 0.05 to 2 parts by mass, even more preferably from 0.1 to 1 part by mass. Using the catalyst in the amount falling within the range is preferred as promoting the reaction between the epoxy resin (a) and the vinyl group-containing monocarboxylic acid (b).

For the purpose of preventing polymerization during the reaction, it is desirable to use a polymerization inhibitor. The polymerization inhibitor includes, for example, hydroquinone, methylhydroquinone, hydroquinone monomethyl ether, catechol, pyrogallol, etc.

The amount of the polymerization inhibitor to be used is preferably from 0.01 to 1 part by mass relative to 100 parts by mass of the total of the epoxy resin (a) and the vinyl group-containing monocarboxylic acid (b), more preferably from 0.02 to 0.8 parts by mass, even more preferably from 0.04 to 0.50 parts by mass. Using the inhibitor in the amount falling within the range is preferred as improving the storage stability of the composition.

The reaction temperature in the reaction between the epoxy resin (a) and the vinyl group-containing monocarboxylic acid (b) is, from the viewpoint of the productivity, preferably from 60 to 150° C., more preferably from 80 to 120° C., even more preferably from 90 to 110° C.

If desired, along with the vinyl group-containing monocarboxylic acid (b), usable here is a phenolic compound such as p-hydroxyphenethyl alcohol, etc., or a polybasic acid anhydride such as trimellitic anhydride, pyromellitic anhydride, benzophenonetetracarboxylic anhydride, biphenyltetracarboxylic anhydride, etc.

The resin (A') obtained through reaction of the epoxy resin (a) and the vinyl group-containing monocarboxylic acid (b) in the manner as above is presumed to contain a hydroxyl group formed through the addition reaction between the epoxy group in the epoxy resin (a) and the carboxyl group in the vinyl group-containing monocarboxylic acid (b).

It is presumed that, by further reacting the resin (A') obtained in the above with a saturated or unsaturated group-containing polybasic acid anhydride (c), the hydroxyl group in the resin (A') (including the hydroxyl group originally existing in the epoxy resin (a)) and the acid anhydride group in the polybasic acid anhydride (c) could be semi-esterified.

[Polybasic Acid Anhydride (c)]

As the polybasic acid anhydride (c), usable here are those containing a saturated group and those containing an unsaturated group. Specific examples of the polybasic acid anhydride (c) include succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahydrophthalic anhydride, ethylhexahydrophthalic anhydride, itaconic anhydride, etc. Of those, preferred is tetrahydrophthalic anhydride from the viewpoint of obtaining a photosensitive resin composition capable of forming a pattern excellent in resolution.

In the reaction between the resin (A') and the polybasic acid anhydride (c), by reacting from 0.1 to 1.0 equivalent of the polybasic acid anhydride (c) relative to one equivalent of the hydroxyl group in the resin (A'), the acid value of the acid-modified vinyl group-containing epoxy resin can be controlled.

The acid value of the acid-modified vinyl group-containing epoxy resin (A) is preferably from 30 to 150 mg KOH/g, more preferably from 40 to 120 mg KOH/g, even more preferably from 50 to 100 mg KOH/g. The acid value of 30 mg KOH/g or more increases the solubility of the photosensitive resin composition in a dilute alkali solution, and the acid value of 150 mg KOH/g or less improves the electric characteristics of the cured film of the composition.

The reaction temperature in the reaction between the resin (A') and the polybasic acid anhydride (c) is, from the viewpoint of the productivity, preferably from 50 to 150° C., more preferably from 60 to 120° C., even more preferably from 70 to 100° C.

If desired, as the epoxy resin (a), for example, a hydrogenated bisphenol A-type epoxy resin may also be partially used here. Further, as the acid modified vinyl group-containing epoxy resin (A), also partially usable here is a styrene-maleic acid resin such as a hydroxyethyl(meth)acrylate-modified derivative of a styrene-maleic anhydride copolymer, etc.

(Molecular Weight of Component (A))

The weight-average molecular weight of the acid-modified vinyl group-containing epoxy resin (A) is preferably from 3,000 to 30,000, more preferably from 4,000 to 25,000, even more preferably from 5,000 to 18,000. The weight-average molecular weight of the component (A) falling within the above range makes it possible to provide a pattern excellent in resist profile and excellent in resolution, and makes it possible to realize excellent heat resistance, adhesiveness and electric insulation. Here, the weight-average molecular weight is a polystyrene-equivalent weight-average molecular weight measured according to a method of gel permeation chromatography (GPC) using tetrahydrofuran as a solvent. More concretely, for example, using the GPC apparatus mentioned below and under the measurement condition also mentioned below, the resin sample is analyzed, and using the calibration curve of a standard polystyrene, the found data are converted to give the weight-average molecular weight. For preparing the calibration curve, 5 sample sets of standard polystyrene ("PStQuick MP-H" and "PStQuick B", manufactured by Tosoh Corporation) are used.

(GPC Apparatus)
  GPC Device: high-speed GPC device "HCL-8320GPC", with a differential refractometer or UV as the detector, manufactured by Tosoh Corporation
  Column: column TSK gel SuperMultipore HZ-H (column length: 15 cm, column inner diameter: 4.6 mm), manufactured by Tosoh Corporation (Measurement Condition)
  Solvent: tetrahydrofuran (THF)
  Measurement temperature: 40° C.
  Flow rate: 0.35 ml/min
  Sample concentration: 10 mg/THF 5 ml
  Injection volume: 20 µl (Content of Component (A))

The content of the acid-modified vinyl group-containing epoxy resin (A) in the photosensitive resin composition is, based on the total solid content in the photosensitive resin composition, preferably from 20 to 80% by mass, more preferably from 30 to 70% by mass, even more preferably from 30 to 50% by mass. The content of the component (A) falling within the range makes it possible to form a coating film more excellent in heat resistance, electric characteristics and chemical resistance.

(Total Content of Component (A1) and Component (A2) in Component (A))

The total content of the acid-modified vinyl group-containing epoxy resins (A1) and (A2) in the acid-modified vinyl group-containing epoxy resin (A) for use in the present invention is, from the viewpoint of obtaining a photosensitive resin composition capable of forming a pattern excellent in electroless platability, soldering heat resistance and resolution, preferably from 80 to 100% by mass, more preferably from 90 to 100% by mass, even more preferably from 95 to 100% by mass, especially preferably 100% by mass.

(Ratio by Mass of Acid-Modified Vinyl Group-Containing Epoxy Resins (A1) to (A2))

The ratio by mass of the acid-modified vinyl group-containing epoxy resins (A1) to (A2) (A1/A2) in the acid-modified vinyl group-containing epoxy resin (A) for use in the present invention is, from the viewpoint of obtaining a photosensitive resin composition capable of forming a pattern excellent in electroless platability, soldering heat resistance and resolution, preferably from 30/70 to 90/10, more preferably from 40/60 to 80/20, even more preferably from 50/50 to 70/30.

<(B) Photopolymerization Initiator>

The photopolymerization initiator (B) for use in the present invention may be any known, already-existing photopolymerization initiator including alkylphenone photopolymerization initiators, acylphosphine oxide photopolymerization initiators, titanocene photopolymerization initiators, etc. Of those, preferred are acylphosphine oxide photopolymerization initiators from the viewpoint of obtaining a photosensitive resin composition capable of forming a pattern excellent in electroless platability, soldering heat resistance and resolution.

Not specifically limited, the acylphosphine oxide photopolymerization initiator may be any photopolymerization initiator having an acylphosphine oxide group (=P(=O)—C(=O)— group) and includes, for example, (2,6-dimethoxybenzoyl)-2,4,4-pentylphosphine oxide, 2,4,6-trimethylbenzoyldiphenylphosphine oxide, ethyl-2,4,6-trimethylbenzoylphenyl phosphinate, bis(2,4,6-trimethylbenzoyl)-phenylphosphine oxide, (2,5-dihydroxyphenyl)diphenylphosphine oxide, (p-hydroxyphenyl)diphenylphosphine oxide, bis(p-hydroxyphenyl)phenylphosphineoxide, tris(p-hydroxyphenyl)phosphine oxide, bis(2,6-dimethoxybenzoyl)-2,4,4-trimethylpentylphosphine oxide, etc. One alone or two or more of these may be used here either singly or as combined.

(Content of Component (B))

The content of the photopolymerization initiator (B) in the photosensitive resin composition is, from the viewpoint of obtaining a photosensitive resin composition capable of forming a pattern excellent in resolution, and on the basis of the total solid content in the photosensitive resin composition, preferably from 0.2 to 15.0% by mass, more preferably from 0.4 to 5.0% by mass, even more preferably from 0.6 to 1.0% by mass. The content of the photopolymerization initiator (B) of 0.2% by mass or more may protect the exposed area from dissolution during exposure, and the content of 15.0% by mass or less may prevent the reduction in heat resistance of the composition.

<(C) Thiol Group-Containing Compound>

Not specifically limited, the thiol group-containing compound (C) may be any compound having a thiol group. The thiol group-containing compound (C) is considered to effectively function as a hydrogen donor and to exhibit the effect of more improving the sensitivity and the aging stability of the photosensitive resin composition.

Here, the hydrogen donor means a compound capable of donating a hydrogen atom to the radical to be generated through photoexposure treatment with the above-mentioned photopolymerization initiator. In the present invention, a combination of the above-mentioned acylphosphine oxide photopolymerization initiator and, as a hydrogen donor, the thiol group-containing compound (C) is especially effective in the point of forming a pattern having good pattern outline linearity and excellent in resist morphology and resolution.

The thiol group-containing compound (C) includes, for example, mercaptobenzoxazole (MBO), mercaptobenzothiazole (MBT), mercaptobenzimidazole (MBI), ethanethiol, benzenethiol, mercaptophenol, mercaptotoluene, 2-mercaptoethylamine, mercaptoethyl alcohol, mercaptoxylene, thioxylenol, 2-mercaptoquinoline, mercaptoacetic acid, α-mercaptopropionic acid, 3-mercaptopropionic acid, mercaptosuccinic acid, thiosalicylic acid, mercaptocyclohexane, α-mercaptodiphenylmethane, C-mercaptotetrazole, mercaptonaphthalene, mercaptonaphthol, 4-mercaptobiphenyl, mercaptohypoxanthine, mercaptopyridine, 2-mercaptopyrimidine, mercaptopurine, thiocoumazone, thiocoumothiazone, butane-2,3-dithiol, thiocyanuric acid, 2,4,6-trimercapto-s-triazine, 2-dibutylamino-4,6-dimercapto-s-triazine, 2-anilino-4,6-dimercapto-s-triazine, etc. One alone or two or more of these thiol group-containing compounds (C) may be used here either singly or as combined. Of those, preferred are mercaptobenzoxazole (MBO), mercaptobenzothiazole (MBT) and mercaptobenzimidazole (MBI) from the viewpoint that these can effectively function as a hydrogen donor and can improve more the sensitivity and the aging stability of the photosensitive resin composition. More preferred is mercaptobenzimidazole (MBI).

(Content of Component (C))

The content of the thiol group-containing compound (C) in the photosensitive resin composition is, from the viewpoint of obtaining a photosensitive resin composition excellent in resolution, and on the basis of the total solid content in the photosensitive resin composition, preferably from 0.01 to 5% by mass, more preferably from 0.1 to 3% by mass, even more preferably from 0.2 to 1.5% by mass, especially more preferably from 0.6 to 1.2% by mass.

The content of the thiol group-containing compound (C) of 0.01% by mass or more tends to make a solution of the photosensitive resin composition hardly gel, and the content of 5% by mass or less may prevent the sensitivity of the composition from lowering.

In addition, one alone or two or more other photopolymerization initiators of tertiary amines such as ethyl N,N-dimethylaminobenzoate, isoamyl N,N-dimethylaminobenzoate, pentyl 4-dimethylaminobenzoate, triethylamine, triethanolamine and the like may also be used here either singly or as combined.

<(D) Pigment>

A pigment (D) is preferably used in accordance with the desired color in masking the wiring pattern here. As the pigment (D), a colorant capable of providing the desired color may be suitably selected and used here. For example, preferably mentioned are known colorants such as phthalocyanine blue, phthalocyanine green, iodine green, diazo yellow, crystal violet, titanium oxide, carbon black, naphthalene black, etc.

(Content of Component (D))

The content of the pigment (D) in the photosensitive resin composition is, based on the total solid content in the photosensitive resin composition, preferably from 0.1 to 5% by mass, more preferably from 0.1 to 3% by mass, even more preferably from 0.5 to 2% by mass. The content of the pigment (D) falling within the above range is preferred from the viewpoint of masking the wiring pattern.

<(E) Photopolymerizable Compound>

Not specifically limited, the photopolymerizable compound (E) may be any compound having a photopolymerizable functional group, for example, an ethylene oxide-type unsaturated group such as a vinyl group, an allyl group, a propargyl group, a butenyl group, an ethynyl group, a phenylethynyl group, a maleimide group, a nadimide group, a (meth)acryloyl group, etc. From the viewpoint of the reactivity thereof, preferred is a compound having a (meth)acryloyl group.

Preferred examples of the photopolymerizable compound (E) for use in the present invention include, for example, hydroxyalkyl(meth)acrylates such as 2-hydroxyethyl(meth)acrylate, 2-hydroxypropyl(meth)acrylate, etc.; mono or di(meth)acrylates of glycols such as ethylene glycol, methoxytetraethylene glycol, polyethylene glycol, etc.; (meth)acrylamides such as N,N-dimethyl(meth)acrylamide, N-methylol(meth)acrylamide, etc.; aminoalkyl(meth)acrylates such as N,N-dimethylaminoethyl(meth)acrylate, etc.; polyalcohols or poly(meth)acrylates of ethylene oxide or propylene oxide adducts thereof, such as hexanediol, trimethylolpropane, pentaerythritol, ditrimethylolpropane, dipentaerythritol, tris-hydroxyethyl isocyanurate, etc.; (meth)acrylates of ethylene oxide or propylene oxide adducts of phenols, such as phenoxyethyl(meth)acrylate, bisphenol A polyethoxydi(meth)acrylate, etc.; glycidyl ether (meth)acrylates such as glycerin diglycidyl ether, trimethylolpropane triglycidyl ether, triglycicyl isocyanurate, etc.; melamine(meth)acrylate, etc. One alone or two or more of these photopolymerizable compounds (E) may be used here either singly or as combined.

(Content of Component (E))

The content of the photopolymerizable compound (E) in the photosensitive resin composition is, based on the total solid content in the photosensitive resin composition, preferably from 2 to 50% by mass, more preferably from 5 to 20% by mass, even more preferably from 5 to 10% by mass. The content of the photopolymerizable compound (E) of 2% by mass or more may prevent the tendency of dissolution of the exposed area during development owing to the low photosensitivity of the composition, and the content of 50% by mass or less may prevent the reduction in the heat resistance of the composition.

<(F) Inorganic Filler>

The photosensitive resin composition of the present invention may further contain an inorganic filler (F) for further improving various characteristics such as the adhesiveness, the coating film hardness and the like of the composition.

As the inorganic filler (F), for example, usable here are silica ($SiO_2$), alumina ($Al_2O_3$), titania ($TiO_2$), tantalum oxide ($Ta_2O_5$), zirconia ($ZrO_2$), silicon nitride ($Si_3N_4$), barium titanate ($BaO.TiO_2$), barium carbonate ($BaCO_3$), magnesium carbonate, aluminium oxide, aluminium hydroxide, magnesium hydroxide, lead titanate ($PbO \cdot TiO_2$), lead zirconate titanate (PZT), lead lanthanum zirconate titanate (PLZT), gallium oxide ($Ga_2O_3$), spinel ($MgO \cdot Al_2O_3$), mullite ($3Al_2O_3 \cdot 2SiO_2$), cordierite ($2MgO \cdot 2Al_2O_3/5SiO_2$), talc ($3MgO \cdot 4SiO_2 \cdot H_2O$), aluminium titanate ($TiO_2$—$Al_2O_3$), yttria-containing zirconia ($Y_2O_3$—$ZrO_2$), barium silicate ($BaO \cdot 8SiO_2$), boron nitride (BN), calcium carbonate ($CaCO_3$), barium sulfate ($BaSO_4$), calcium sulfate ($CaSO_4$), zinc oxide (ZnO), magnesium titanate ($MgO \cdot TiO_2$), hydrotalcite, mica, fired kaolin, carbon (C), etc. One alone or two or more of these inorganic fillers may be used here either singly or as combined.

The maximum particle size of the inorganic filler (F) is preferably from 0.1 to 20 μm, more preferably from 0.1 to 10 mm, even more preferably from 0.1 to 5 μm, still more preferably from 0.1 to 1 μm. The maximum particle size of 20 μm or less makes it possible to prevent reduction in the insulating reliability of the composition. Here, the maximum particle size of the inorganic filler (F) is one measured according to a laser diffraction method (according to JIS Z8825-1 (2001)).

Of the inorganic fillers (F), preferred is use of silica fine particles from the viewpoint of the ability thereof to improve the heat resistance of the composition; and from the viewpoint of the ability thereof to improve the soldering heat resistance, the cracking resistance (thermal shock resistance) and the adhesion strength between the underfill material and the cured film after the PCT-resistance test of the composition, also preferred is use of barium sulfate fine particles. The barium sulfate fine particles are preferably ones that have been surface-treated with an alumina and/or an organic silane compound, from the viewpoint of the ability thereof to improve the effect of preventing aggregation of the particles.

The aluminium element composition in the surface of the barium sulfate fine particles that have been surface-treated with an alumina and/or an organic silane compound is preferably from 0.5 to 10 at. %, more preferably from 1 to 5 at. %, even more preferably from 1.5 to 3.5 at. %. In addition, the silicon element composition in the surface of the barium sulfate fine particles is preferably from 0.5 to 10 at. %, more preferably from 1 to 5 at. %, even more preferably from 1.5 to 3.5 at. %. The carbon element composition in the surface of the barium sulfate fine particles is preferably from 10 to 30 at. %, more preferably from 15 to 25 at. %, even more preferably from 18 to 23 at. %. The element composition may be determined through XPS.

The barium sulfate fine particles surface-treated with an alumina and/or an organic silane compound are commercially available, for example, as NanoFine BFN40DC (trade name, manufactured by Solvay Japan, Ltd.).

(Content of Component (F))

The content of the inorganic filler (F) in the photosensitive resin composition is, based on the total solid content in the photosensitive resin composition, preferably from 10 to 80% by mass, more preferably from 15 to 70% by mass, even more preferably from 20 to 50% by mass, still more preferably from 25 to 40% by mass. The content of the inorganic filler (F) falling within the above-mentioned range makes it possible to improve more the film strength, the heat resistance, the insulation reliability, the thermal shock resistance, the resolution and the like of the photosensitive resin composition.

In a case where barium sulfate is used as the inorganic filler (F), the content of barium sulfate in the photosensitive resin composition is, based on the total solid content in the photosensitive resin composition, from 5 to 60% by mass, more preferably from 10 to 50% by mass, even more preferably from 15 to 40% by mass, still more preferably from 20 to 30% by mass. The content of the barium sulfate fine particles falling within the above-mentioned range makes it possible to more improve the soldering heat resistance and the adhesion strength between the underfill material and the cured film after the PCT resistance test of the composition.

<(G) Other Epoxy Resin>

If desired, the photosensitive resin composition of the present invention may further contain, as incorporated therein, any other epoxy resin (G) than the component (A). The epoxy resin (G) includes, for example, a tetramethyl-bisphenol F-type epoxy resin, YSLV-80XY (trade name, manufactured by Nippon Steel Chemical Co., Ltd.); a novolak-type polyfunctional epoxy resin, RE-306 (trade name, manufactured by Nippon Kayaku Co., Ltd.), etc.

<Diluent>

If desired, a diluent may be used in the photosensitive resin composition of the present invention. As the diluent, for example, usable are an organic solvent, a photopolymerizable monomer, etc. The organic solvent includes, for example, ketones such as methyl ethyl ketone, cyclohexanone, etc.; aromatic hydrocarbons such as toluene, xylene, tetramethylbenzene, etc.; glycol ethers such as methyl cellosolve, butyl cellosolve, methyl carbitol, butyl carbitol, propylene glycol monomethyl ether, dipropylene glycol monoethyl ether, dipropylene glycol diethyl ether, triethylene glycol monoethyl ether, etc.; esters such as ethyl acetate, butyl acetate, butyl cellosolve acetate, carbitol acetate, etc.; aliphatic hydrocarbons such as octane, decane, etc.; petroleum solvents such as petroleum ether, petroleum naphtha, hydrogenated petroleum naphtha, sorbent naphtha, etc.

The amount of the diluent to be used is such that the total solid content in the resultant photosensitive resin composition could be preferably from 50 to 90% by mass, more preferably from 60 to 80% by mass, even more preferably from 65 to 75% by mass. Specifically, the content of the diluent, if any, in the photosensitive resin composition is preferably from 10 to 50% by mass, more preferably from 20 to 40% by mass, even more preferably from 25 to 35% by mass. The amount of the diluent to be used that falls within the above-mentioned range makes it possible to improve the coatability with the photosensitive resin composition and makes it possible to form a higher-resolution pattern.

<Curing Agent>

The photosensitive resin composition of the present invention may contain a curing agent. The curing agent includes a compound that is self-curable with heat, UV ray or the like, or a compound that cures with the carboxyl group or the hydroxyl group in the acid-modified vinyl group-containing epoxy resin (A), which is the photocurable resin component in the composition of the present invention, by heat, UV ray or the like. Using the curing agent improves the heat resistance, the adhesiveness, the chemical resistance and the like of the final cured film.

The curing agent includes, for example, an epoxy compound, a melamine compound, an urea compound, an oxazoline compound and the like, as a heat-curable compound. The epoxy compound includes, for example, a bisphenol A-type epoxy resin, a bisphenol F-type epoxy resin, a hydrogenated bisphenol A-type epoxy resin, a brominated bisphenol A-type epoxy resin, a novolak epoxy resin, a bisphenol S-type epoxy resin, a biphenyl epoxy resin, a heterocyclic epoxy resin such as triglycidyl isocyanurate or the like, a bixylenol-type epoxy resin, etc. The melamine compound includes, for example, triaminotriazine, hexamethoxymelamine, hexabutoxylated melamine, etc. The urea compound includes dimethylolurea, etc.

From the viewpoint of more improving the heat resistance of the cured film, the curing agent preferably contains an epoxy compound (epoxy resin) and/or a blocked isocyanate, and is more preferably a combination of an epoxy compound and a blocked isocyanate.

As the blocked isocyanate, usable here is an addition reaction product of a polyisocyanate compound and an isocyanate blocking agent. The polyisocyanate compound includes, for example, polyisocyanate compounds such as tolylene diisocyanate, xylylene diisocyanate, phenylene diisocyanate, naphthylene diisocyanate, bis(isocyanatemethyl)cyclohexane, tetramethylene diisocyanate hexamethylene diisocyanate, methylene diisocyanate, trimethylhexamethylene diisocyanate, isophorone diisocyanate, etc.; as well as adducts, burets, isocyanurates of those compounds, etc.

The isocyanate blocking agent includes, for example, phenol-type blocking agents such as phenol, cresol, xylenol, chlorophenol, ethylphenol, etc.; lactam-type blocking agents such as ε-caprolactam, δ-valerolactam, γ-butyrolactam, β-propiolactam, etc.; active methylene-type blocking agents such as ethyl acetoacetate, acetylacetone, etc.; alcohol-type blocking agents such as methanol, ethanol, propanol, butanol, amyl alcohol, ethylene glycol monomethyl ether, ethylene glycol monoethyl ether, ethylene glycol monobutyl ether, diethylene glycol monomethyl ether, propylene glycol monomethyl ether, benzyl ether, methyl glycolate, butyl glycolate, diacetone alcohol, methyl lactate, ethyl lactate, etc.; oxime-type blocking agents such as formaldehyde oxime, acetaldehyde oxime, acetoxime, methyl ethyl ketoxime, diacetyl monoxime, cyclohexane oxime, etc.; mercaptan-type blocking agents such as butylmercaptan, hexylmercaptan, t-butylmercaptan, thiophenol, methylthiophenol, ethylthiophenol, etc.; amide-type blocking agents such as acetamide, benzamide, etc.; imide-type blocking agents such as succinimide, maleimide, etc.; amine-type blocking agents such as xylidine, aniline, butylamine, dibutylamine, etc.; imidazole-type blocking agents such as imidazole, 2-ethylimidazole, etc.; imine-type blocking agents such as methyleneimine, propyleneimine, etc.

One alone or two or more curing agents may be used here either singly or as combined. When used, the content of the curing agent is, based on the total solid content in the photosensitive resin composition, preferably from 2 to 40% by mass, more preferably from 3 to 30% by mass, even more preferably from 5 to 20% by mass. The content of the curing agent falling within the above-mentioned range makes it possible to improve more the heat resistance of the cured film to be formed while maintaining the good developability thereof.

The photosensitive resin composition of the present invention may additionally contain an epoxy resin curing agent, as incorporated therein for the purpose of further improving various characteristics such as the heat resistance, the adhesiveness, the chemical resistance and the like of the final cured film.

Specific examples of the epoxy resin curing agent include, for example, imidazole derivatives such as 2-methylimidazole, 2-ethyl-4-methylimidazole, 1-benzyl-2-methylimidazole, 2-phenylimidazole, 2-phenyl-4-methyl-5-hydroxymethylimidazole, etc.; guanamines such as acetoguanamine, benzoguanamine, etc.; polyamines such as diaminodiphenylmethane, m-phenylenediamine, m-xylylenediamine, diaminodiphenyl sulfone, dicyandiamide, urea, urea derivatives, melamine, polybasic hydrazides, etc.; organic acid salts and/or epoxy adducts of these compounds; boron trifluoride amine complexes; triazine derivatives such as ethyldiamino-S-triazine, 2,4-diamino-S-triazine, 2,4-diamino-6-xylyl-S-triazine, etc.; tertiary amines such as trimethylamine, N,N-dimethyloctylamine, N-benzyldimethylamine, pyridine, N-methylmorpholine, hexa(N-methyl)melamine, 2,4,6-tris (dimethylaminophenol), tetramethylguanidine, m-aminophenol, etc.; polyphenols such as polyvinylphenol, polyvinylphenol bromide, phenol novolak, alkylphenol novolak, etc.; organic phosphines such as tributyl phosphine, triphenyl phosphine, tris-2-cyanoethyl phosphine, etc.; phosphonium salts such as tri-n-butyl(2,5-dihydroxyphenyl)phosphonium bromide, hexadecyltributylphosphonium chloride, etc.; quaternary ammonium salts such as benzyltrimethylammonium chloride, phenyltributylammonium chloride, etc.; polybasic acid anhydrides of these compounds; diphenyliodonium tetrafluoroborate, triphenylsulfonium hexafluoroantimonate, 2,4,6-triphenylthiopyrylium hexafluorophosphate, etc.

One alone or two or more epoxy resin curing agents may be used here either singly or as combined. The content of the epoxy resin curing agent to be in the photosensitive resin composition is, based on the total solid content in the photosensitive resin composition, preferably from 0.01 to 20% by mass, more preferably from 0.1 to 10% by mass.

<Other Additives>

If desired, the photosensitive resin composition of the present invention may further contain, as incorporated therein, any known common additives of a polymerization inhibitor such as hydroquinone, methylhydroquinone, hydroquinone monomethyl ether, catechol, pyrogallol, etc.; a tackifier such as bentonite, montmorillonite, etc.; a defoaming agent such as silicone compounds, fluorine compounds, vinyl resins, etc.; a silane coupling agent, etc. Further, the composition may also contain, as incorporated therein, a flame retardant such as a bromoepoxy compound, an acid-modified bromoepoxy compound, an antimony compound, a phosphate compound of a phosphorus compound, an aromatic condensed phosphate ester, a halogen-containing condensed phosphate ester, etc.

Also if desired, the photosensitive resin composition of the present invention may further contain, as added thereto, an (I) cyanamide compound such as dicyandiamide, etc.; or a (J) triazine compound such as melamine, etc.

<(H) Elastomer>

The photosensitive resin composition of the present invention may contain an elastomer (H). The elastomer (H) is favorably used in a case where the photosensitive resin composition of the present invention is used for a semiconductor package substrate. Adding the elastomer (H) to the photosensitive resin composition of the present invention promotes the crosslinking reaction (curing reaction) by UV ray or heat to thereby inhibit the reduction in the flexibility and the adhesiveness of the composition owing to the strain (internal stress) inside the resin through curing shrinkage of the acid-modified vinyl group-containing epoxy resin (A).

The elastomer (H) includes a styrenic elastomer, an olefinic elastomer, an urethanic elastomer, a polyester elastomer, a polyamide elastomer, an acrylic elastomer, a silicone elastomer, etc. These elastomers each contain a hard segment component and a soft segment component, in which, in general, the former contributes toward heat resistance and strength while the latter towards flexibility and toughness.

The styrenic elastomer includes a styrene-butadiene-styrene block copolymer, a styrene-isoprene-styrene block copolymer, a styrene -ethylene -butylene-styrene block copolymer, a styrene-ethylene-propylene-styrene block copolymer. In addition to styrene that is a component to constitute the styrenic elastomer, a styrene derivative is usable, such as α-methylstyrene, 3-methylstyrene, 4-propylstyrene, 4-cyclohexylstyrene, etc. Concretely, there are mentioned Toughprene, Solprene T, Asaprene T, Toughtec (all manufactured by Asahi Chemical Industry Co., Ltd., "Toughprene" is a registered trademark, and "Toughtec" is a registered trademark), Elastomer AR (manufactured by Aron Chemical Co., Ltd.), Kraton G, Califlex (both manufactured by Shell Japan Limited), JSR-TR, TSR-SIS, Dynaron (all manufactured by JSR Corporation), Denka STR (manufactured by Denki Kagaku Kogyo Kabushiki Kaisha), Quintac (manufactured by Nippon Zeon Co., Ltd., "Quintac" is a registered trademark), TPE-SB series (manufactured by Sumitomo Chemical Industry Co., Ltd.), Rabalon (manufactured by Mitsubishi Chemical Corporation, "Rabalon" is a registered trademark), Septon, Hybrar (both by Kuraray Co., Ltd., "Hybrar" is a registered trademark, "Septon" is a registered trademark), Sumiflex (manufactured by Sumitomo Bakelite Co., Ltd., "Sumiflex" is a registered trademark), Rheostomer, Actymer (both by Riken Vinyl Industry Co., Ltd., "Rheostomer" is a registered trademark, "Actymer" is a registered trademark), etc.

The olefinic elastomer is a copolymer of an α-olefin having from 2 to 20 carbon atoms such as ethylene, propylene, 1-butene, 1-hexene, 4-methyl-pentene, etc., and includes, for example, an ethylene-propylene copolymer (EPR), an ethylene-propylene-diene copolymer (EPDM), etc. In addition, also mentioned is an α-olefin copolymer with a nonconjugated diene having from 2 to 20 carbon atoms such as dicyclopentadiene, 1,4-hexadiene, cyclooctadiene, methylenenorbornene, ethylidenenorbornene, butadiene, isoprene or the like, etc.

Also mentioned is a carboxy-modified NBR prepared through copolymerization of a butadiene-acrylonitrile copolymer with methacrylic acid, concretely including an ethylene-α-olefin copolymer rubber, an ethylene-α-olefin-nonconjugated diene copolymer rubber, a propylene-α-olefin copolymer rubber, a butene-α-olefin copolymer rubber, etc. Further, concretely, Milastomer (manufactured by Mitsui Petrochemical Co., Ltd.), EXACT (manufactured by Exxon Co., Ltd.), ENGAGE (manufactured by Dow Chemical Co., Ltd.), hydrogenated styrene-butadiene rubber "DYNABON HSBR" (manufactured by JSR Corporation), butadiene-acrylonitrile copolymer "NBR series" (manufactured by JSR Corporation), as well as crosslinking point-having, both-terminal carboxyl group-modified butadiene-acrylonitrile copolymer "XER series" (manufactured by JSR Corporation) and the like are commercially available.

The urethane elastomer contains a structural unit of a hard segment composed of a low-molecular glycol and a diisocyanate and a soft segment composed of a high-molecular (long-chain) diol and a diisocyanate, in which the high-molecular (long-chain) diol incudes polypropylene glycol, polytetramethylene oxide, poly(1,4-butylene adipate), poly (ethylene-1,4-butylene adipate), polycaprolactone, poly(1,6-hexylene carbonate), poly(1,6-hexylene-neopentylene adipate), etc.

The number-average molecular weight of the high-molecular (long-chain) diol is preferably from 500 to 10,000. In addition to ethylene glycol, also usable is a short-chain diol such as propylene glycol, 1,4-butanediol, bisphenol A, etc. The number-average molecular weight of the short-chain diol is preferably from 48 to 500. As specific examples of the urethane elastomer, PANDEX T-2185, T-2983N (manufactured by DIC Corporation), Miractran E790 and the like are commercially available.

The polyester elastomer includes those obtained through polycondensation of a dicarboxylic acid or a derivative thereof and a diol compound or a derivative thereof. Specific examples of the dicarboxylic acid includes aromatic dicarboxylic acids such as terephthalic acid, isophthalic acid, naphthalenedicarboxylic acid, etc.; aromatic dicarboxylic acids derived from those by substituting the hydrogen atom of the aromatic nucleus thereof with a methyl group, an ethyl group, a phenyl group or the like; aliphatic dicarboxylic acids having from 2 to 20 carbon atoms such as adipic acid, sebacic acid, dodecanedicarboxylic acid, etc.; alicyclic dicarboxylic acids such as cyclohexanedicarboxylic acid, etc. One alone or two or more of these compounds may be used here.

Specific examples of the diol compound include aliphatic diols and alicyclic diols such as ethylene glycol, 1,3-propanediol, 1,4-butanediol, 1,6-hexanediol, 1,10-decanediol, 1,4-cyclohexanecliol, etc.; and diphenols represented by the following general formula (VI).

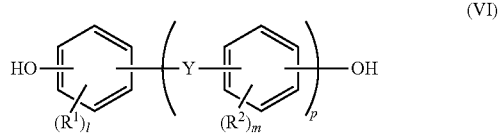

(VI)

In the general formula (VI), Y is selected from a group consisting of an alkylene group having from 1 to 10 carbon atoms, a cycloalkylene group having from 4 to 8 carbon atoms, —O—, —S— and —SO$_2$—, and the benzene rings directly bond to each other, and R$^1$ and R$^2$ each represent a hydrogen atom, a halogen atom, or an alkyl group having from 1 to 12 carbon atoms, 1 and m each indicate an integer of from 0 to 4, p indicates 0 or 1. The alkylene group and the cycloalkylene group may be linear or branched, and may be substituted with a halogen atom, an alkyl group, an aryl group, an aralkyl group, an amino group, an amide group, an alkoxy group or the like.

Specific examples of the diphenol represented by the general formula (VI) include bisphenol A, bis-(4-hydroxyphenyl)methane, bis(4-hydroxy-3-methylphenyl)propane, resorcin, etc. One alone or two or more of these compounds may be used here.

Also usable here is a multi-block copolymer containing an aromatic polyester (for example, polybutylene terephthalate) moiety as a hard segment component and an aliphatic polyester (for example, polytetramethylene glycol) moiety as a soft segment component. Depending on the type, the ratio and the molecular weight of the hard segment and the soft segment, there exist various grades of those copolymers. Concretely, Hytrel (manufactured by DuPont-Toray Co., Ltd., "Hytrel" is a registered trademark), Pelprene (manufactured by Toyobo Co., Ltd., "Pelprene" is a registered trademark), Espel (manufactured by Hitachi Chemical Company, Ltd., "Espel" is a registered trademark) and the like are commercially available.

The polyamide elastomer is roughly classified into two types of a polyether block amide-type elastomer and a polyether ester block amide-type elastomer using a polyamide as the hard phase and a polyether or a polyester as the soft phase therein. As the polyamide, usable is Polyamide-6, 11, 12 or the like, and as the polyether, usable is polyoxyethylene, polyoxypropylene, polytetramethylene glycol or the like. Concretely UBE Polyamide Elastomer (manufactured by Ube Industries, Ltd.), Diamide (manufactured by Daicel Huels Co., Ltd., "Diamide" is a registered trademark), PEBAX (manufactured by Toray Co., Ltd.), Grilon ELY (manufactured by Emus Japan, Ltd., "Grilon" is a registered trademark), Novamid (manufactured by Mitsubishi Chemical Co., Ltd.), Grilux (manufactured by DIC Corporation) and others are commercially available.

The acrylic elastomer contains an acrylate as the main ingredient thereof, for which usable here is ethyl acrylate, butyl acrylate, methoxyethyl acrylate, ethoxyethyl acrylate or the like. As the crosslinking point monomer, usable is glycidyl methacrylate, allyl glycidyl ether or the like. Further, acrylonitrile or ethylene may be copolymerized with the elastomer. Concretely, there are mentioned an acrylonitrile-butyl acrylate copolymer, an acrylonitrile-butyl acrylate-ethyl acrylate copolymer, an acrylonitrile-butyl acrylate-glycidyl methacrylate copolymer, etc.

The silicone elastomer contains an organopolysiloxane as the main ingredient thereof, and may be classified into a polydimethylsiloxane-type elastomer, a polymethylphenylsiloxane-type elastomer, and a polydiphenylsiloxane-type elastomer. Also usable here are those prepared by partially modifying the elastomers with a vinyl group, an alkoxy group or the like. Concretely, KE series (manufactured by Shin-Etsu Chemical Industry Co., Ltd.), SE series, CY series, SH series (all by Toray-Dow Corning Silicone Co., Ltd.) and the like are commercially available.

Apart from the above-mentioned thermoplastic elastomers, also usable here are rubber-modified epoxy resins. The rubber-modified epoxy resins may be prepared by modifying a part or all of the epoxy groups in the above-mentioned bisphenol F-type epoxy resin, bisphenol A-type epoxy resin, salicylaldehyde-type epoxy resin, phenol-novolak-type epoxy resin or cresol-novolak-type epoxy resin, with a both-terminal carboxylic acid-modified butadiene-acrylonitrile rubber, a terminal amino-modified silicone rubber or the like. Of those elastomers, preferred are a both-terminal carboxyl group-modified butadiene-acrylonitrile copolymer, and Espel (manufactured by Hitachi Chemical Company, Ltd., Espel 1612, 1620) that is a hydroxyl group-having polyester elastomer, from the viewpoint of the shear bond strength of the composition.

The amount of the elastomer (H) to be incorporated is preferably from 2 to 40 parts by mass relative to 100 parts by mass of the acid-modified vinyl group-containing epoxy resin (A), more preferably from 4 to 30 parts by mass, even more preferably from 10 to 25 parts by mass, still more preferably from 15 to 22 parts by mass. The amount of 2% by mass or more tends to lower the modulus of elasticity of the cured film in a high-temperature region, and the amount of 40% by mass or less tends to readily dissolve the unexposed area with a developer.

The photosensitive resin composition of the present invention may be obtained by uniformly kneading and mixing the compounding compounds in a roll mill, a bead mill, etc.

[Dry Film]

The dry film of the present invention has a carrier film and a photosensitive layer using the photosensitive resin composition of the present invention.

The thickness of the photosensitive layer is preferably from 10 to 50 µm, more preferably from 15 to 40 µm, even more preferably from 20 to 30 µm.

The dry film of the present invention may be produced, for example, by applying the photosensitive resin composition of the present invention onto a carrier film of a low-density polyethylene, a high-density polyethylene, a polypropylene, a polyester, a polycarbonate, a polyarylate, an ethylene/cyclodecene copolymer, a polyethylene terephthalate or the like, according to a known method using a reverse roll coater, a gravure roll coater, a comma coater, a curtain coater or the like, then drying it thereon to thereby form a photosensitive layer of the photosensitive resin composition of the present invention on the carrier film, and optionally sticking a cover film thereto.

The coating film may be dried with hot air or using a drier with far-IR ray or near-IR ray, and the drying temperature is preferably from 60 to 120° C., more preferably from 70 to 110° C., even more preferably from 80 to 100° C. The drying time is preferably from 1 to 60 minutes, more preferably from 2 to 30 minutes, even more preferably from 5 to 20 minutes.

[Printed Wiring Board]

The printed wiring board of the present invention comprises a permanent mask resist formed of the photosensitive resin composition of the present invention.

The printed wiring board of the present invention comprises a permanent mask resist formed of the photosensitive resin composition of the present invention, and the pattern which has good pattern profile linearity and is excellent in resist profile and in resolution, since an undercut where the bottom part of the resist is bored is not caused or the upper part of the resist is not caused to be dropped off, whereby the line width of the intermediate part (center part) and the deepest part (bottom part) in the pattern cross section is not increased as compared with the line width of the surface part thereof. Furthermore, the permanent mask resist may form a pattern excellent in morphology stability for the small-sized holes to be formed in the resist and for the narrowed distance between the holes with the recent tendency toward mini-sized high-performance electronic instruments.

[Production Method for Printed Wiring Board]

The method for producing a printed wiring board of the present invention comprises, in this order, a step of providing, on a substrate, a photosensitive layer using the photosensitive resin composition of the present invention or the dry film of the present invention, a step of patterning the photosensitive layer, and a step of curing the photosensitive layer to form a permanent mask resist.

Concretely, the printed wiring board may be produced as follows.

First, the resin composition of the present invention is applied onto a substrate on which a resist is to be formed, such as a metal-clad laminate such as a copper-clad laminate or the like, or a resin-attached copper foil, a silicon wafer provided with a metal-sputtered film, an alumina substrate or the like, according to a screen printing method, a spraying method, a roll coating method, a curtain coating method, an electrostatic coating method or the like method to form thereon a coating film to have preferably from 10 to 200 µm, more preferably from 15 to 150 µm, even more preferably from 20 to 100 µm, still more preferably from 23 to 50 µm, and then the coating film is dried at 60 to 110° C., or the dry film of the present invention, from which the cover film has been peeled off, is thermally laminated onto the above-mentioned substrate to thereby provide a photosensitive layer on the substrate.

Next, the photosensitive layer is, while kept in direct contact with a negative film (or in a non-contact mode therewith via a transparent film set therebetween), irradiated with active ray, preferably in a dose of from 10 to 2,000 mJ/cm$^2$, more preferably from 100 to 1,500 mJ/cm$^2$, even more preferably from 300 to 1,000 mJ/cm$^2$, and thereafter, the unexposed area is dissolved away (developed) with an aqueous dilute alkali solution to form a pattern. The active ray to be used includes electron beam, UV ray, X-ray, etc., and is preferably UV ray. The light source to be used includes a low-pressure mercury lamp, a high-pressure mercury lamp, an ultra-high-pressure mercury lamp, a halogen lamp etc.

Next, the exposed area of the photosensitive layer is post-exposed (UV exposure) and/or post-heated to fully cure it to form a permanent mask resist.

The post-exposure condition is preferably from 100 to 5,000 mJ/cm$^2$, more preferably from 500 to 2,000 mJ/cm$^2$, even more preferably from 700 to 1,500 mJ/cm$^2$.

The heating temperature for post-heating is preferably from 100 to 200° C., more preferably from 120 to 180° C., even more preferably from 135 to 165° C.

The heating time for the post-heating is preferably from 5 minutes to 12 hours, more preferably from 10 minutes to 6 hours, even more preferably from 30 minutes to 2 hours.

Subsequently, a wiring interconnection is formed by etching to give a printed wiring board.

EXAMPLES

The present invention is described more concretely with reference to Examples and Comparative Examples given hereinunder; however, the present invention is not limited to the following Examples.

Synthesis Example 1

350 parts by mass of a bisphenol F novolak epoxy resin (a) (EXA-7376, manufactured by DIC Corporation; bisphenol F novolak epoxy resin having a structural unit of the general formula (IV) where Y$^4$ and Y$^5$ each are a glycidyl group, and R$^{13}$ is a hydrogen atom), 70 parts by mass of acrylic acid (b), 0.5 parts by mass of methylhydroquinone, and 120 parts by mass of carbitol acetate were put into a reactor, and reacted by stirring under heat at 90° C. to completely dissolve the mixture. Next, the resultant solution was cooled to 60° C., then 2 parts by mass of triphenyl phosphine was added thereto, heated at 100° C. and reacted until the acid value of the solution could reach 1 mg KOH/g. 98 parts by mass of tetrahydrophthalic anhydride (THPAC) (c) and 85 parts by mass of carbitol acetate were added to the solution after the reaction, and heated at 80° C. and reacted for 6 hours. Subsequently, this was cooled to room temperature to give a THPAC-modified bisphenol F novolak epoxy acrylate as the acid-modified vinyl group-containing epoxy resin component (A1) having a solid concentration of 73% by mass.

Synthesis Example 2

1,052 parts by mass of a bisphenol F-type epoxy resin (bisphenol F-type epoxy resin having a structural unit of the general formula (II) where Y$^2$ is a hydrogen atom, and R$^{12}$ is a hydrogen atom) (epoxy equivalent: 526), 144 parts by mass of acrylic acid (b), 1 part by mass of methylhydroquinone, 850 parts by mass of carbitol acetate and 100 parts by mass of sorbent naphtha were put into a flask equipped with a stirrer, a reflux condenser and a thermometer, and heated with stirring at 70° C. to dissolve the mixture. Next, the solution was cooled to 50° C., then 2 parts by mass of triphenyl phosphine and 75 parts by mass of solvent naphtha were added thereto, heated at 100° C. and reacted until the solid acid value could reach 1 mg KOH/g or less. Next, the resultant solution was cooled to 50° C., then 745 parts by mass of tetrahydrophthalic anhydride (THPAC) (c), 75 parts by mass of carbitol acetate and 75 parts by mass of solvent naphtha were added thereto, and heated at 80° C. and reacted for 6 hours. Subsequently, this was cooled to room temperature to give a THPAC-modified bisphenol F-type epoxy acrylate as the acid-modified vinyl group-containing epoxy resin component (A2) having a solid acid value of 80 mg KOH/g and a solid content of 62% by mass.

Synthesis Example 3

220 parts by mass of a cresol-novolak epoxy resin (a) (manufactured by Tohto Chemical Industry Co., Ltd., trade name "YDCN704", novolak epoxy resin of the general formula (I) where Y$^1$ is a glycidyl group and R$^{11}$ is a methyl group), 72 parts by mass of acrylic acid (b), 1.0 part by mass of hydroquinone, and 180 parts by mass of carbitol acetate were put into a reactor, and heated with stirring at 90° C. to dissolve the reaction mixture. Next, the resultant solution was cooled to 60° C., and 1 part by mass of benzyltrimethylammonium chloride was added thereto, then heated at 100° C. and reacted until the solid acid value could reach 1 mg KOH/g. Further, 152 parts by mass of tetrahydrophthalic anhydride (c) and 100 parts by mass of carbitol acetate were added thereto, heated at 80° C. and reacted for 6 hours. Subsequently, this was cooled to room temperature, and diluted with carbitol acetate so as to have a solid concentration of 60% by mass, thereby giving a THPAC-modified cresol-novolak epoxy acrylate as the acid-modified vinyl group-containing epoxy resin component (A2).

Examples 1 to 4, Comparative Examples 1 to 3, and Comparative Examples 7 to 8

Compositions were formulated according to the compounding formulation shown in Table 1, and kneaded each in a 3-roll mill to give photosensitive resin compositions. Carbitol acetate was added thereto in order that the solid concentration could reach 70% by mass, thereby providing photosensitive resin composition.

TABLE 1

| Component | | Material | Example | | | | Comparative Example | | | | |
|---|---|---|---|---|---|---|---|---|---|---|---|
| | | | 1 | 2 | 3 | 4 | 1 | 2 | 3 | 7 | 8 |
| A | A1 | Acid-Modified Vinyl Group-Containing Epoxy Resin Obtained in Synthesis Example 1 | 21.81 | 21.81 | 21.81 | 21.81 | 22.14 | 22.14 | 0 | 36.33 | 0 |
| | A2 | Acid-Modified Vinyl Group-Containing Epoxy | 14.52 | 14.52 | 14.52 | 14.52 | 14.74 | 14.74 | 36.33 | 0 | 14.52 |

TABLE 1-continued

| | | Example | | | | Comparative Example | | | | |
|---|---|---|---|---|---|---|---|---|---|---|
| Component | Material | 1 | 2 | 3 | 4 | 1 | 2 | 3 | 7 | 8 |
| | Resin Obtained in Synthesis Example 2 Acid-Modified Vinyl Group-Containing Epoxy Resin Obtained in Synthesis Example 3 | 0 | 0 | 0 | 0 | 0 | 0 | 0 | 0 | 21.81 |
| B | Irgacure 819 | 0.77 | 0.77 | 0 | 0 | 0.78 | 0 | 0.77 | 0.77 | 0.77 |
| | Irgacure 907 | 0 | 0 | 0.83 | 0.83 | 0 | 0.84 | 0 | 0 | 0 |
| | DETX | 0.03 | 0.03 | 0.03 | 0.03 | 0.03 | 0.03 | 0.03 | 0.03 | 0.03 |
| C | MBI | 0.92 | 0.92 | 0.92 | 0.92 | 0 | 0 | 0.93 | 0.93 | 0.93 |
| D | Phthalocyanine Pigment | 0.94 | 0.94 | 0.94 | 0.94 | 0.95 | 0.95 | 0.94 | 0.94 | 0.94 |
| E | Aronix M402 | 7.38 | 7.38 | 7.38 | 7.38 | 7.49 | 7.49 | 7.38 | 7.38 | 7.38 |
| F | ASA | 22.77 | 22.77 | 22.77 | 22.77 | 23.11 | 23.11 | 22.77 | 22.77 | 22.77 |
| | FUSE-LEX | 6.29 | 6.29 | 6.29 | 6.29 | 6.38 | 6.38 | 6.29 | 6.29 | 6.29 |
| G | YSLV-80XY | 13.09 | 13.09 | 13.09 | 13.09 | 13.28 | 13.28 | 13.08 | 13.08 | 13.08 |
| | RE-306 | 3.88 | 3.88 | 3.88 | 3.88 | 3.94 | 3.94 | 3.88 | 3.88 | 3.88 |
| H | PB-3600 | 3.04 | 3.04 | 3.04 | 3.04 | 3.09 | 3.09 | 3.04 | 3.04 | 3.04 |
| | SP1108 | 4.01 | 4.01 | 4.01 | 4.01 | 4.07 | 4.07 | 4.01 | 4.01 | 4.01 |
| I | DICY 7 | 0.55 | 0 | 0.55 | 0 | 0 | 0 | 0 | 0 | 0 |
| J | Melamine | 0 | 0.55 | 0 | 0.55 | 0 | 0 | 0.55 | 0.55 | 0.55 |

* The numerals in the table means an amount (% by mass) of each component based on the total solid amount of each photosensitive resin composition.

The details of the materials in Table 1 are as follows.
Irgacure 819: bis(2,4,6-trimethylbenzoyl)phenyl phosphine oxide (manufactured by BASF Japan Limited, trade name)
Irgacure 907: 2-methyl-[4-(methylthio)phenyl]morpholino-1-propanone (manufactured by BASF Japan Limited, trade name)
DETX: DETX-S, 2,4-diethylthioxanthone (manufactured by Nippon Kayaku Co., Ltd., trade name)
MBI: mercaptobenzimidazole
Phthalocyanine Pigment: manufactured by Sanyo Color Works Ltd.
Aronix M402: dipentaerythritol hexacrylate (manufactured by Toa Gosei Co., Ltd., trade name)
ASA: barium sulfate fine particles (manufactured by Solvay Japan, Ltd.)
FUSE-LEX: silicon dioxide (manufactured by Tatsumori Co., Ltd., trade name)
YSLV-80XY: tetramethylbisphenol F-type epoxy resin (manufactured by Nippon Steel Chemical Co., Ltd., trade name)
RE-306: novolak-type polyfunctional epoxy resin (manufactured by Nippon Kayaku Co., Ltd., trade name)
PB-3600: epoxidized polybutadiene (manufactured by Daicel Chemical Co., Ltd., trade name)
SP1108: polyester resin (manufactured by Hitachi Chemical Co., Ltd., trade name)
DICY 7: dicyandiamide Next, using the photosensitive resin composition obtained in the above, samples were evaluated under the conditions mentioned below. The evaluation results are shown in Table 1.

[Production of Test Pieces]

The photosensitive resin composition of Examples and Comparative Examples was applied onto a copper-clad laminate having a thickness of 0.6 mm (MCL-E-67, manufactured by Hitachi Chemical Co., Ltd.) in such a manner that the thickness of the coating film after dried could be 35 according to a screen printing method, and then dried at 80° C. for 20 minutes using a hot air-circulating drier. Next, a negative mask having a predetermined pattern was airtightly attached to the coating film, and using a UV exposure apparatus, the film was exposed at an exposure dose of 600 mJ/cm². Subsequently, this was spray-developed with an aqueous 1 mass % sodium carbonate solution for 60 seconds under a pressure of 1.765×10⁶ Pa, to thereby dissolve the unexposed area through development. Next, using a UV exposure apparatus, this was exposed at an exposure dose of 1000 mJ/cm², and then heated at 150° C. for 1 hour to prepare a test piece.

[Resist Shape]

An epoxy resin (Epikote 828: manufactured by Japan Epoxy Resin Co., Ltd., and containing triethyltetramine as a curing agent) was cast onto the test piece and fully cured, and then using a polisher (REFINEPOLISHER; Refine Tec Co., Ltd.), the cross section of the pattern was ground and cut out, and the shape of the resist was observed with a metallograph. The sample was evaluated according to the following criteria.

A: In the resist form, neither undercut nor resist top dropping was confirmed, and the linearity of the pattern outline profile was good (see FIG. 1).

Figure 2:
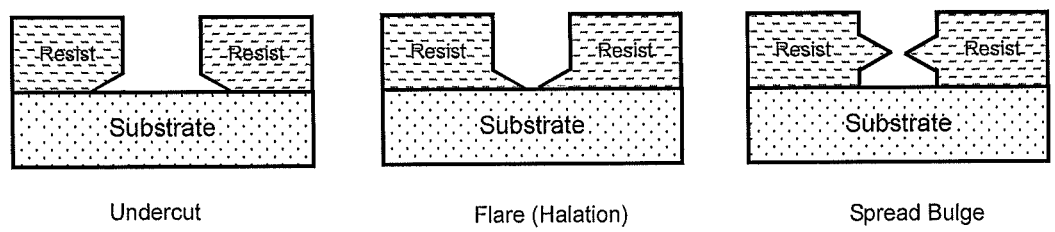
FIG. 2 shows schematic views of no-good resist cross section profiles.

B: In the resist form, undercut and resist top dropping were confirmed, and the linearity of the pattern outline profile was bad (see FIG. 2).

[Electroless Platability]

Using a commercially-available electroless nickel plating bath and a commercially-available electroless gold plating bath, the test piece was plated under the condition of nickel 5 μm and gold 0.05 μm. After the test, the test piece was visually checked for the presence or absence of plate penetration, and for the presence or absence of resist layer peeling in the tape peeling test, and evaluated according to the following criteria.

3: Neither penetration nor peeling was seen.
2: Some penetration was seen after plating, but no peeling was seen.
1: After plating, the plate peeled.

[Soldering Heat Resistance]

A water-soluble flux was applied onto the test piece, and immersed in a solder bath at 265° C. for 10 seconds. This is one cycle. Each test piece was subjected to 6 cycles, and then the outward appearance of the coating film was visually checked, and evaluated according to the following criteria.

3: No appearance change was seen in the coating film in the range of 30 cm×30 cm.

2: From 1 to 5 blisters or swells were seen in the coating film in the range of 30 cm×30 cm.

1: 6 or more blisters or swells were seen in the coating film in the range of 30 cm×30 cm.

[Cracking Resistance]

The test piece was tested in a cycle test in which one cycle is −65° C. for 30 minutes/(room temperature: 25° C.)/150° C. for 30 minutes. Each test piece was subjected to 1000 cycles, and then the outward appearance of the coating film thereof was visually checked and evaluated according to the following criteria.

3: No appearance change was seen in the coating film in the range of 30 cm×30 cm.

2: From 1 to 5 blisters or swells were seen in the coating film in the range of 30 cm×30 cm.

1: 6 or more blisters or swells were seen in the coating film in the range of 30 cm×30 cm.

[Adhesiveness]

The photosensitive resin composition of Examples and Comparative Examples was applied onto a copper-clad laminate having a thickness of 0.6 mm (MCL-E-67, manufactured by Hitachi Chemical Co., Ltd.) that had been buff-polished on the copper surface thereof (5 μm roughening in the depth direction), and to a copper-clad laminate having a thickness of 0.6 mm (MCL-E-67, manufactured by Hitachi Chemical Co., Ltd.) that had been chemically polished (0.5 μm roughening in the depth direction, using an abrasive CZ8101 manufactured by MEC Co., Ltd.), each in such a manner that the thickness of the coating film after dried could be 35 μm according to a screen printing method, and then dried at 80° C. for 20 minutes using a hot air-circulating drier. Next, a negative mask having a predetermined pattern was airtightly attached to the coating film, and using a UV exposure apparatus, the film was exposed at an exposure dose of 600 mJ/cm$^2$. Subsequently, this was spray-developed with an aqueous 1 mass % sodium carbonate solution for 60 seconds under a pressure of 1.765×10$^5$ Pa, to thereby dissolve the unexposed area through development. Next, using a UV exposure apparatus, this was exposed at an exposure dose of 1000 mJ/cm$^2$, and then heated at 150° C. for 1 hour to prepare a test piece.

Next, according to JIS C5012-1974, 100 crosscuts of 1 mm were formed on the test piece, which was then tested in a peel test with an adhesive cellophane tape. The surface was checked for the peeling condition of the crosscuts, and evaluated according to the following criteria. In the peel test, the adhesive tape was rapidly peeled in the direction vertical to the printed surface.

3: No peeling was seen in 90/100 or more.

2: No peeling was seen in from 50/100 to less than 90/100.

1: No peeling was seen in from 0/100 to less than 50/100.

[Solvent Resistance]

The test piece was immersed in isopropyl alcohol at room temperature (25° C.—the same shall apply hereunder) for 30 minutes, and checked for the presence or absence of any abnormal appearance change therein, and thereafter the test piece was tested in the peel test with an adhesive cellophane tape.

3: Neither change nor peeling was seen in the appearance of the coating film.

2: Minor change was seen.

1: The appearance of the coating film changed or peeled.

[Acid Resistance]

The test piece was immersed in an aqueous 10 mass % hydrochloric acid solution at room temperature for 30 minutes, and checked for the presence or absence of any abnormal appearance change therein, and thereafter the test piece was tested in the peel test with an adhesive cellophane tape.

3: Neither change nor peeling was seen in the appearance of the coating film.

2: Minor change was seen.

1: The appearance of the coating film changed or peeled.

[Alkali Resistance]

The test piece was immersed in an aqueous 5 mass % sodium hydroxide solution at room temperature for 30 minutes, and checked for the presence or absence of any abnormal appearance change therein, and thereafter the test piece was tested in the peel test with an adhesive cellophane tape.

3: Neither change nor peeling was seen in the appearance of the coating film.

2: Minor change was seen.

1: The appearance of the coating film changed or peeled.

TABLE 2

| Characteristics | Example | | | | Comparative Example | | | | |
|---|---|---|---|---|---|---|---|---|---|
| | 1 | 2 | 3 | 4 | 1 | 2 | 3 | 7 | 8 |
| Resist Form | A | A | A | A | B | B | B | B | B |
| Electroless Platability | 3 | 3 | 3 | 3 | 1 | 1 | 1 | 1 | 1 |
| Soldering Heat Resistance | 3 | 3 | 3 | 3 | 1 | 1 | 1 | 1 | 1 |
| Cracking Resistance | 3 | 3 | 3 | 3 | 3 | 3 | 1 | 1 | 1 |
| Adhesiveness | 3 | 3 | 3 | 3 | 3 | 3 | 3 | 3 | 3 |
| Solvent Resistance | 3 | 3 | 3 | 3 | 3 | 3 | 3 | 3 | 3 |
| Acid Resistance | 3 | 3 | 3 | 3 | 3 | 3 | 3 | 3 | 3 |
| Alkali Resistance | 3 | 3 | 3 | 3 | 3 | 3 | 3 | 3 | 3 |

Examples 5 to 8, Comparative Examples 4 to 6, and Comparative Examples 9 to 10

The photosensitive resin compositions of Examples 1 to 4, Comparative Examples 1 to 3 and Comparative Examples 7 to 8, as formulated according to the compound formulation shown in Table 1, were diluted with methyl ethyl ketone, and each composition was applied onto a polyethylene terephthalate (PET) film, and dried at 90° C. for 10 minutes to form thereon a photosensitive layer of the photosensitive resin composition having a thickness of 25 μm. A cover film was stuck on it to produce a dry film.

[Evaluation of Dry Film]

The cover film was removed from the dry film produced in the above, and the dry film was thermally laminated on a solid copper foil substrate, and then exposed under the same condition as that for the coating film characteristics evaluation in Example 1. Next, a negative mask having a predetermined pattern was airtightly attached to the coating film, and using a UV exposure apparatus, the film was exposed at an exposure dose of 600 mJ/cm$^2$. After the exposure, this was spray-developed with an aqueous 1 mass % sodium carbonate solution for 60 seconds under a pressure of 1.765×10$^5$ Pa, to thereby dissolve the unexposed area through development. Next, using a UV exposure apparatus, this was exposed at an exposure dose of 1000 mJ/cm$^2$, and then heated at 150° C. for 1 hour to prepare a test piece.

The resultant test pieces were evaluated in the same manner as in Example 1. The results are shown in Table 3.

TABLE 3

| Characteristics | Example | | | | Comparative Example | | | | |
|---|---|---|---|---|---|---|---|---|---|
| | 5 | 6 | 7 | 8 | 4 | 5 | 6 | 9 | 10 |
| Resist Form | A | A | A | A | B | B | B | B | B |
| Electroless Platability | 3 | 3 | 3 | 3 | 1 | 1 | 1 | 1 | 1 |
| Soldering Heat Resistance | 3 | 3 | 3 | 3 | 1 | 1 | 1 | 1 | 1 |
| Cracking Resistance | 3 | 3 | 3 | 3 | 3 | 3 | 1 | 1 | 1 |
| Adhesiveness | 3 | 3 | 3 | 3 | 3 | 3 | 3 | 3 | 3 |
| Solvent Resistance | 3 | 3 | 3 | 3 | 3 | 3 | 3 | 3 | 3 |
| Acid Resistance | 3 | 3 | 3 | 3 | 3 | 3 | 3 | 3 | 3 |
| Alkali Resistance | 3 | 3 | 3 | 3 | 3 | 3 | 3 | 3 | 3 |

From the results shown in Tables 2 and 3, Examples 1 to 8 each using the photosensitive resin composition of the present invention maintained bottom curability and were excellent in the resist form. On the other hand, Comparative Examples 1 to 10 could not solve the problem of bottom curability and the problem of resist form, and provided unsatisfactory results.

The invention claimed is:

1. A dry film having a carrier film and a photosensitive layer formed from a photosensitive resin composition comprising (A) an acid-modified vinyl group-containing epoxy resin, (B) a photopolymerization initiator, (C) a thiol group-containing compound, and (E) photopolymerizable compound, wherein the component (A) contains at least one acid-modified vinyl group-containing epoxy resin (A1) which is obtained from a bisphenol-novolak epoxy resin (a1) having a structural unit represented by the following general formula (IV) or (V), and an acid-modified vinyl group-containing epoxy resin (A2) which is obtained from an epoxy resin (a2) differing from the epoxy resin (a1):

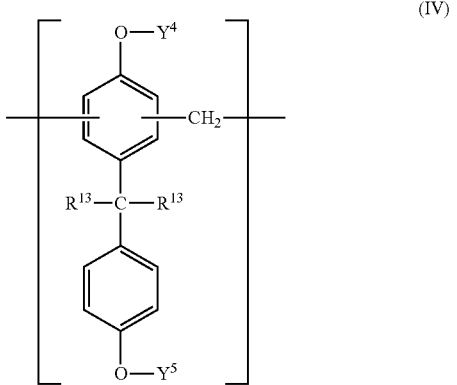

(IV)

wherein $R^{13}$ represents a hydrogen atom or a methyl group, $Y^4$ and $Y^5$ each independently represent a hydrogen atom or a glycidyl group, and plural $R^{13}$'s may be the same or different, with the proviso that at least one of the $Y^4$ and $Y^5$ is a glycidyl group;

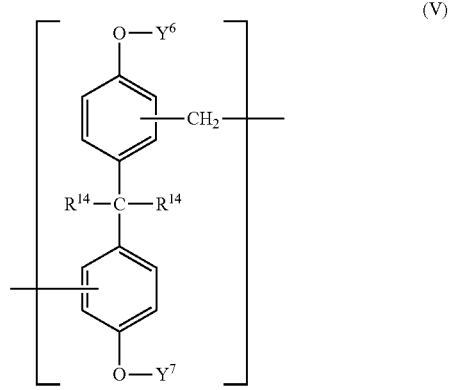

(V)

wherein $R^{14}$ represents a hydrogen atom or a methyl group, $Y^6$ and $Y^7$ each independently represent a hydrogen atom or a glycidyl group, and plural $R^{14}$'s may be the same or different, with the proviso that at least one of the $Y^6$ and $Y^7$ is a gylcidyl group, and wherein the thiol group-containing compound (C) is at least one selected from mercaptobenzoxazole, mercaptobenzothiazole and mercaptobenzimidazole.

2. The dry film according to claim 1, wherein the epoxy resin (a2) is at least one selected from a novolak epoxy resin having a structural unit represented by the following general formula (I), an epoxy resin represented by the following general formula (II'), and an epoxy resin represented by the following general formula (III')

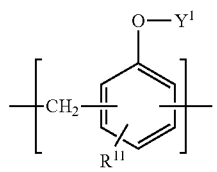

(I)

wherein $R^{11}$ represents a hydrogen atom or a methyl group and $Y^1$ represents a hydrogen atom or a glycidyl group;

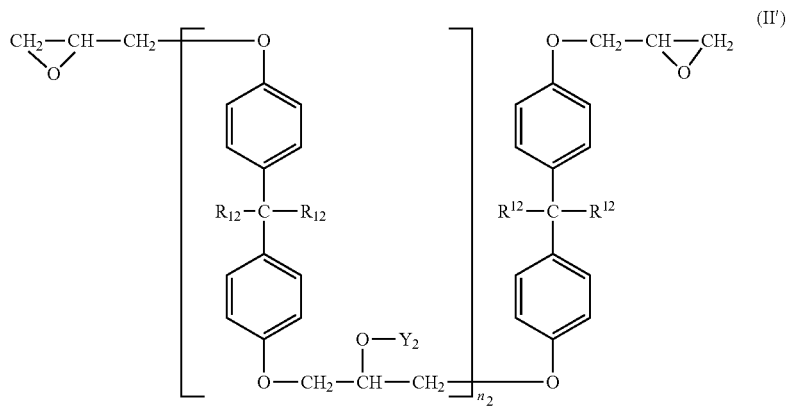

wherein $R^{12}$ represents a hydrogen atom or a methyl group, $Y^2$ represents a hydrogen atom or a glycidyl group, plural $R^{12}$'s may be the same or different, and $n_2$ indicates a number from 1 to 100;

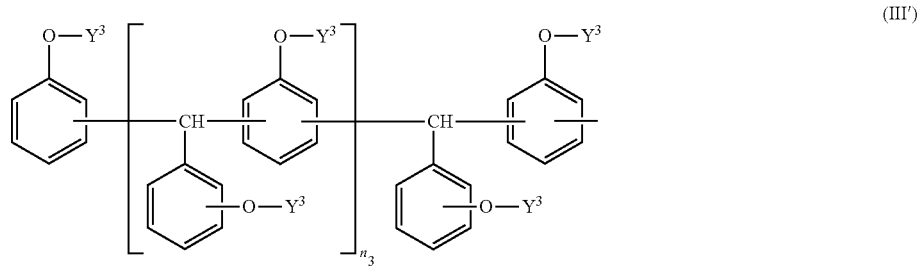

wherein $Y^3$ represents a hydrogen atom or a glycidyl group and plural $Y^3$'s may be the same or different, with the proviso that at least one of $Y^3$ is a glycidyl group, and $n_3$ indicates a number from 1 to 100.

3. The dry film according to claim 2, wherein the acid-modified vinyl group containing epoxy resin (A1) is one obtained from a bisphenol-novolak epoxy resin containing a structural unit represented by a general formula (IV), and the acid-modified vinyl group-containing epoxy resin (A2) is one obtained from an epoxy resin represented by the general formula (II').

4. The dry film according to claim 1, wherein the photopolymerization initiator (B) is an acylphosphine oxide photopolymerization initiator.

5. The dry film according to claim 1, wherein the photopolymerizable compound (E) is a compound having a (meth) acryloyl group.

6. The dry film according to claim 1, wherein the acid-modified vinyl group-containing epoxy resins (A1) and (A2) are resins obtained by reacting the epoxy resins (a1) and (a2), respectively, with a vinyl group-containing monocarboxylic acid (b) to obtain, respectively, resins (A1') and (A2'), and reacting resins (A1') and (A2'), respectively, with a saturated or unsaturated group-containing polybasic acid anhydride (c).

7. The dry film according to claim 1, further comprising an inorganic filler (F).

8. The dry film according to claim 1, further comprising a pigment (D).

9. A printed wiring board comprising a permanent mark resist formed of the dry film having a carrier film and a photosensitive layer according to claim 1.

10. A method for producing a printed wiring board, comprising, in this order, a step of providing, on a substrate, a photosensitive layer formed from the dry film having a carrier film and a photosensitive layer according to claim 1, a step of patterning the photosensitive layer, and a step of curing the photosensitive layer to form a permanent mask resist.

11. A dry film having a carrier film and a photosensitive layer formed from a photosensitive resin composition comprising (A) an acid-modified vinyl group-containing epoxy resin, (B) a photopolymerization initiator, (C) a thiol group-containing compound, and (E) a photopolymerizable compound, wherein the component (A) contains at least one acid-modified vinyl group-containing expoxy resin (A1) which is obtained from a bisphenol-novolak epoxy resin (a1) having a structural unit represented by the following general formula (IV) or (V), and an acid-modified vinyl group-containing epoxy resin (A2) which is obtained from an epoxy resin (a2) differing from the epoxy resin (a1):

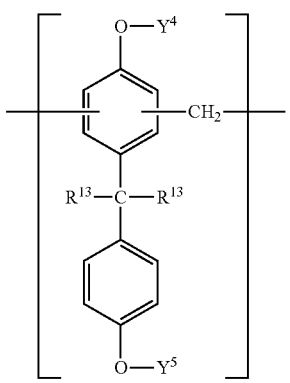

(IV)

wherein $R^{13}$ represents a hydrogen atom or a methyl group, $Y^4$ and $Y^5$ each independently represent a hydrogen atom or a glycidyl group, and plural $R^{13}$'s may be the same or different, with the proviso that at least one of $Y^4$ and $Y^5$ is a glycidyl group;

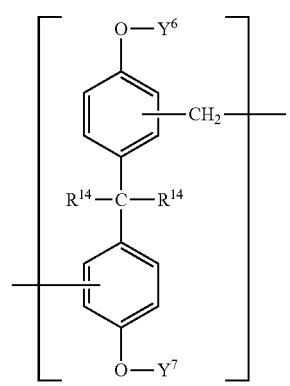

(V)

wherein $R^{14}$ represents a hydrogen atom or a methyl group, $Y^6$ and $Y^7$ each independently represent a hydrogen atom or a glycidyl group, and plural $R^{14}$'s may be the same or different, with the proviso that at least one of $Y^6$ and $Y^7$ is a glycidyl group, and wherein the content of the thiol group-containing compound (C) is, based on the total solid content in the photosensitive resin composition, from 0.01 to 5% by mass.

12. The dry film according to claim 11, wherein the thiol group-containing compound (C) is at least one selected from mercaptobenzoxazole, mercaptobenzothiazole and mercaptobenzimidazole.

13. The dry film according to claim 11, wherein the epoxy resin (a2) is at least one selected from a novolak epoxy resin having a structural unit represented by the following general formula (I), an epoxy resin represented by the following general formula (II'), and an epoxy resin represented by the following general formula (III')

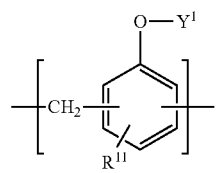

(I)

wherein $R^{11}$ represents a hydrogen atom or a methyl group and $Y^1$ represents a hydrogen atom or a glycidyl group;

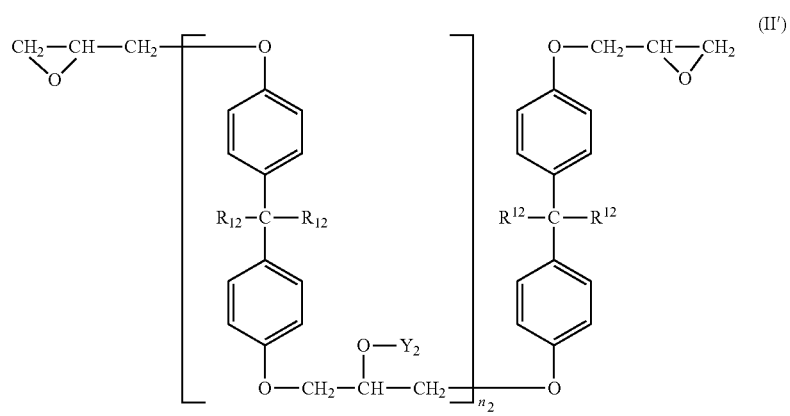

(II')

wherein $R^{12}$ represents a hydrogen atom or a methyl group, $Y^2$ represents a hydrogen atom or a glycidyl group, plural $R^{12}$'s may be the same or different, and $n_2$ indicates a number from 1 to 100;

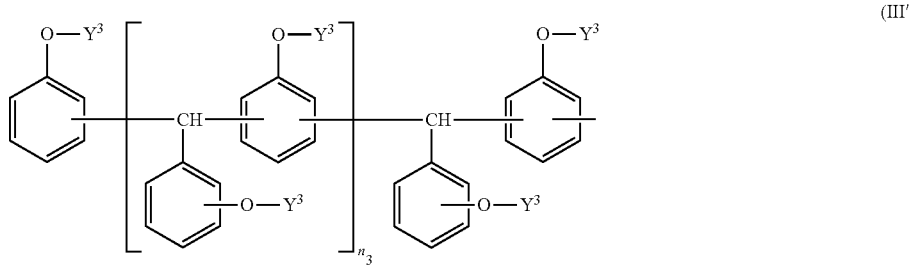

(III′)

wherein $Y^3$ represents a hydrogen atom or a glycidyl group and plural $Y^3$'s may be the same or different, with the proviso that at least one of $Y^3$ is a glycidyl group, and $n_3$ indicates a number from 1 to 100.

14. The dry film according to claim 13, wherein the acid-modified vinyl group-containing epoxy resin (A1) is one obtained from a bisphenol-novolak epoxy resin containing a structural unit represented by the general formula (IV), and the acid-modified vinyl group-containing epoxy resin (A2) is one obtained from an epoxy resin represented by the general formula (II′).

15. The dry film according to claim 11, wherein the photopolymerization initiator (B) is an acylphosphine oxide photopolymerization initiator.

16. The dry film according to claim 11, wherein the photopolymerizable compound (E) is a compound having a (meth)acryloyl group.

17. The dry film according to claim 11, wherein the acid-modified vinyl group-containing epoxy resins (A1) and (A2) are resins obtained by reacting the epoxy resins (a1) and (a2), respectively, with a vinyl group-containing monocarboxylic acid (b) to obtain, respectively, resins (A1′) and (A2′), and reacting resins (A1′) and (A2′), respectively, with a saturated or unsaturated group-containing polybasic acid anhydride (c).

18. The dry film according to claim 11, further comprising an inorganic filler (F).

19. The dry film according to claim 11, further comprising a pigment (D).

20. A printed wiring board comprising a permanent mask resist formed of the dry film having a carrier film and a photosensitive layer according to claim 11.

21. A method for producing a printed wiring board, comprising, in this order, a step of providing, on a substrate, a photosensitive layer formed from the dry film having a carrier film and a photosensitive layer according to claim 11, a step of patterning the photosensitive layer, and a step of curing the photosensitive layer to form a permanent mask resist.

* * * * *